US009895727B2

(12) United States Patent
Nakamura et al.

(10) Patent No.: US 9,895,727 B2
(45) Date of Patent: Feb. 20, 2018

(54) METHOD OF MANUFACTURING SEMICONDUCTOR DEVICE, METHOD OF CLEANING INTERIOR OF PROCESS CHAMBER, SUBSTRATE PROCESSING APPARATUS, AND RECORDING MEDIUM

(71) Applicant: HITACHI KOKUSAI ELECTRIC INC., Tokyo (JP)

(72) Inventors: Yoshinobu Nakamura, Toyama (JP); Masayoshi Minami, Toyama (JP); Masayuki Asai, Toyama (JP); Kazuyuki Okuda, Toyama (JP); Yuji Urano, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/272,844

(22) Filed: Sep. 22, 2016

(65) Prior Publication Data

US 2017/0087606 A1    Mar. 30, 2017

(30) Foreign Application Priority Data

Sep. 28, 2015  (JP) ................................. 2015-189126

(51) Int. Cl.
*B08B 9/093*         (2006.01)
*C23C 16/44*         (2006.01)
(Continued)

(52) U.S. Cl.
CPC .......... *B08B 9/093* (2013.01); *C23C 16/4404* (2013.01); *C23C 16/4405* (2013.01);
(Continued)

(58) Field of Classification Search
CPC .............. B08B 9/093; C23C 16/45544; C23C 16/45527; C23C 16/52; C23C 16/4412;
(Continued)

(56) References Cited

U.S. PATENT DOCUMENTS 8,080,477 B2 * 12/2011 Nodera ................. C23C 16/345
118/723 MP
2006/0121194 A1 * 6/2006 Aiso ......................... B08B 7/00
427/248.1
(Continued)

FOREIGN PATENT DOCUMENTS

JP        2004-247678 A      9/2004
JP        4228008            12/2008
(Continued)

OTHER PUBLICATIONS

Office Action in TW counterpart Application No. 105130143 dated Oct. 20, 2017.
(Continued)

*Primary Examiner* — William Coleman
(74) *Attorney, Agent, or Firm* — Volpe and Koenig, P.C.

(57) ABSTRACT

A method of manufacturing a semiconductor device is disclosed. The method includes processing a substrate by supplying a process gas to the substrate in a process chamber. The method further includes performing a purge to an interior of the process chamber while periodically changing an internal pressure of the process chamber based on a pressure width by setting a process of supplying a purge gas into the process chamber to increase the internal pressure of the process chamber and a process of vacuum-exhausting an interior of the process chamber to decrease the internal pressure of the process chamber to one cycle and repeating the cycle a plurality of times.

21 Claims, 10 Drawing Sheets

(51) Int. Cl.
  *C23C 16/52*   (2006.01)
  *H01L 21/02*   (2006.01)
(52) U.S. Cl.
  CPC ...... *C23C 16/4408* (2013.01); *C23C 16/4412* (2013.01); *C23C 16/52* (2013.01); *H01L 21/0217* (2013.01); *H01L 21/02211* (2013.01); *H01L 21/02271* (2013.01)
(58) Field of Classification Search
  CPC .......... H01L 21/02271; H01L 21/0217; H01L 21/02211
  See application file for complete search history.

(56) References Cited

U.S. PATENT DOCUMENTS

| | | |
|---|---|---|
| 2007/0178669 A1 | 8/2007 | Noda et al. |
| 2008/0050884 A1 | 2/2008 | Koyanagi et al. |
| 2011/0059600 A1* | 3/2011 | Sakai .................. B08B 7/00 438/584 |

FOREIGN PATENT DOCUMENTS

| | | |
|---|---|---|
| JP | 2010-212712 A | 9/2010 |
| JP | 2014-143421 A | 8/2014 |
| KR | 1020060095964 | 9/2006 |

OTHER PUBLICATIONS

Office Action in KR counterpart Application No. 10-2016-0121440 dated Sep. 13, 2017.

* cited by examiner

METHOD OF MANUFACTURING SEMICONDUCTOR DEVICE, METHOD OF CLEANING INTERIOR OF PROCESS CHAMBER, SUBSTRATE PROCESSING APPARATUS, AND RECORDING MEDIUM

CROSS-REFERENCE TO RELATED APPLICATION

This application is based upon and claims the benefit of priority from Japanese Patent Application No. 2015-189126, filed on Sep. 28, 2015, the entire contents of which are incorporated herein by reference.

TECHNICAL FIELD

The present disclosure relates to a method of manufacturing a semiconductor device, a substrate processing apparatus, and a recording medium.

BACKGROUND

A film forming process for forming a film on a substrate accommodated in a process chamber may be performed as one process in manufacturing a semiconductor device. When the film forming process is performed, deposits adhere to the interior of the process chamber. Thus, after the film forming process is performed, a cleaning gas may be supplied into the process chamber in order to perform a cleaning process to remove deposits that adhere to the interior of the process chamber.

Deposits adhering to the interior of the process chamber may be removed through a cleaning process, but a very small solid compound may be generated from a reaction between the deposits and the cleaning gas used during the cleaning process.

SUMMARY

The present disclosure provides some embodiments of a technique capable of enhancing the quality of substrate processing by increasing the effect of removing a compound in a process chamber that is generated during a cleaning process.

According to one embodiment of the present disclosure, there is provided a technique including: processing a substrate by supplying a process gas to the substrate in a process chamber; performing a first purge to an interior of the process chamber while periodically changing an internal pressure of the process chamber based on a first pressure width by setting a process of supplying a purge gas into the process chamber to increase the internal pressure of the process chamber and a process of vacuum-exhausting the interior of the process chamber to decrease the internal pressure of the process chamber to a first one cycle, and repeating the first one cycle a plurality of times; and performing a second purge to the interior of the process chamber while periodically changing the internal pressure of the process chamber based on a second pressure width smaller than the first pressure width by setting a process of supplying a purge gas into the process chamber to increase the internal pressure of the process chamber and a process of vacuum-exhausting the interior of the process chamber to decrease the internal pressure of the process chamber to a second one cycle, and repeating the second one cycle a plurality of times.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
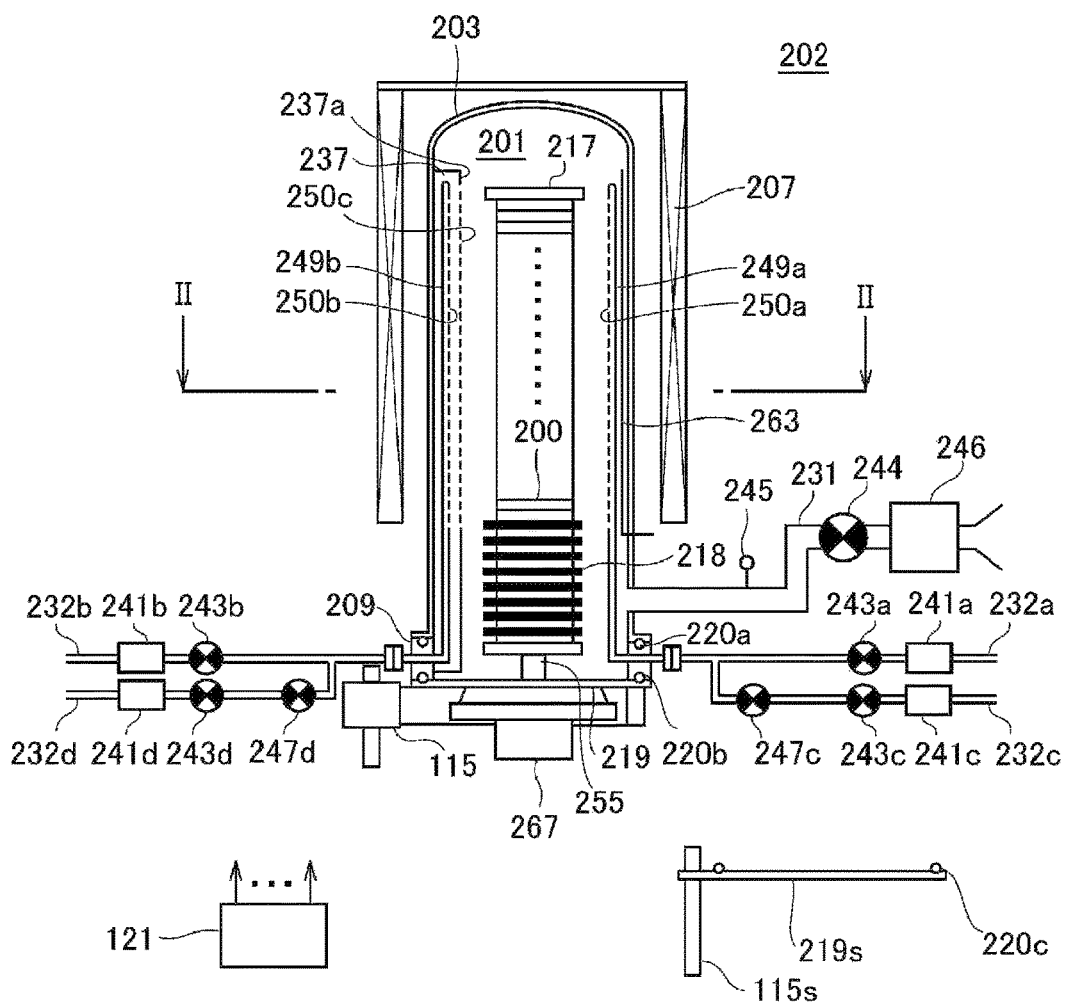
FIG. 1 is a schematic configuration view of a vertical processing furnace of a substrate processing apparatus appropriately used in one embodiment of the present disclosure, in which the processing furnace part is illustrated in a longitudinal cross-sectional view.

As illustrated in FIG. 1, a processing furnace 202 has a heater 207 as a heating mechanism (temperature adjusting part). The heater 207 has a cylindrical shape and is supported by a heater base (not shown) serving as a support plate so as to be vertically installed. The heater 207 also functions as an activation mechanism (excitation part) to thermally activate (excite) a gas, as described later.

A reaction tube 203 is disposed inside the heater 207 in a concentric form with the heater 207. The reaction tube 203 is made of a heat resistant material such as, for example, quartz ($SiO_2$), silicon carbide (SiC), etc. and has a cylindrical shape with its upper end closed and its lower end opened. A manifold (inlet flange) 209 is disposed below the reaction tube 203 in a concentric form with the reaction tube 203. The manifold 209 is made of a metal such as, for example, stainless steel (SUS), etc. and has a cylindrical shape with its upper end and lower end opened. An upper end portion of the manifold 209 is engaged with a lower end portion of the reaction tube 203 to support the reaction tube 203. An O-ring 220a serving as a seal member is installed between the manifold 209 and the reaction tube 203. As the manifold 209 is supported by the heater base, the reaction tube 203 is in a state where it is vertically installed. A process vessel (reaction vessel) is mainly constituted by the reaction tube 203 and the manifold 209. A process chamber 201 is formed in a cylindrical hollow portion of the process vessel. The process chamber 201 is configured to accommodate wafers 200 as a plurality of substrates in a state where the wafers 200 are horizontally arranged in a vertical direction and in a multi-stage manner in a boat 217, which will be described later.

Nozzles 249a and 249b are installed in the process chamber 201 to pass through a sidewall of the manifold 209. Gas supply pipes 232a and 232b are connected to the nozzles 249a and 249b, respectively. In this manner, the two nozzles 249a and 249b, and the two gas supply pipes 232a and 232b are installed in the process vessel (manifold 209) such that plural kinds of gases can be supplied into the process chamber 201.

Mass flow controllers (MFCs) 241a and 241b, which are flow rate controllers (flow rate control parts), and valves 243a and 243b, which are opening/closing valves, are installed in the gas supply pipes 232a and 232b in this order from an upstream side, respectively. Gas supply pipes 232c and 232d configured to supply an inert gas are connected to the gas supply pipes 232a and 232b at downstream sides of the valves 243a and 243b, respectively. MFCs 241c and 241d, which are flow rate controllers (flow rate control parts), and valves 243c, 247c, 243d, and 247d, which are opening/closing valves, are installed in the gas supply pipes 232c and 232d in this order from the upstream side, respectively.

Nozzles 249a and 249b are connected to leading ends of the gas supply pipes 232a and 232b, respectively. As illustrated in FIG. 2, the nozzles 249a and 249b are respectively installed in an annular space between the inner wall of the reaction tube 203 and the wafers 200, when viewed from the plane, so as to extend upward along a stacking direction of the wafers 200 from the lower portion of the inner wall of the reaction tube 203 to the upper portion thereof. That is to say, the nozzles 249a and 249b are respectively installed in a region, which exists at a side of a wafer arrangement region where the wafers 200 are arranged and which horizontally surrounds the wafer arrangement region, so as to extend along the wafer arrangement region. That is to say, the nozzles 249a and 249b are respectively installed to be perpendicular to the surface (flat surface) of the wafer 200 at a lateral side of the end portion (peripheral portion) of each of the wafers 200 loaded into the process chamber 201. Each of the nozzles 249a and 249b is configured as an L-shaped long nozzle, and a horizontal portion of each of the nozzles 249a and 249b is installed to pass through a sidewall of the manifold 209 and a vertical portion thereof is installed to extend upward at least from one end side of the wafer arrangement region toward the other end side thereof. Gas supply holes 250a and 250b, through which gases are supplied, are respectively formed on side surfaces of the nozzles 249a and 249b. The gas supply holes 250a are opened toward the center of the reaction tube 203 to enable gases to be supplied toward the wafers 200. The gas supply holes 250a are plurally formed in a portion spanning from the lower portion of the reaction tube 203 to the upper portion thereof, and each of the gas supply holes 250a has the same opening area and is formed at the same opening pitch. The gas supply holes 250b are opened toward the center of a buffer chamber 237 described later. The gas supply holes 250b are plurally formed in a portion spanning from the lower portion of the reaction tube 203 to the upper portion thereof. The opening area and opening pitch of the gas supply holes 250b will be described later.

The nozzle 249b is installed in the buffer chamber 237 serving as a gas dispersion space. The buffer chamber 237 is formed between the inner wall of the reaction tube 230 and a partition wall 237a. As illustrated in FIG. 2, the buffer chamber 237 (partition wall 237a) is installed in an annular space between the inner wall of the reaction tube 203 and the wafer 200, when viewed from the plane, and also, in a portion spanning from the lower portion to the upper portion of the inner wall of the reaction tube 203 along the stacking direction of the wafer 200. That is to say, the buffer chamber 237 (partition wall 237a) is installed in a region, which exists at the side of the wafer arrangement region and which horizontally surrounds the wafer arrangement region so as to extend along the wafer arrangement region. Gas supply holes 250c configured to supply a gas are formed in an end portion of a surface of the partition wall 237a facing (adjacent to) the wafer 200. The gas supply holes 250c are opened toward the center of the reaction tube 203 such that they can supply the gas toward the wafer 200. Similar to the gas supply holes 250a, the gas supply holes 250c are plurally formed in a portion spanning from the lower portion to the upper portion of the reaction tube 203, and each of the gas supply holes 250c has the same opening area and is formed at the same opening pitch. When a differential pressure in the buffer chamber 237 and in the process chamber 201 is small, the opening area and opening pitch of the plurality of gas supply holes 250b may be set to be equal from an upstream side (lower portion) to a downstream side (upper portion). Further, when a differential pressure in the buffer chamber 237 and in the process chamber 201 is large, the opening area of the gas supply holes 250b may be set to be gradually increased from the upstream side toward the downstream side or the opening pitch of the gas supply holes 250b may be set to be gradually reduced from the upstream side toward the downstream side.

By adjusting the opening area or the opening pitch of each of the gas supply holes 250b from the upstream side to the downstream side as mentioned above, it becomes possible to discharge gases that are different in flow velocity but substantially the same in flow rate, from each of the gas supply holes 250b. Further, once the gas discharged from each of the plurality of gas supply holes 250b is introduced into the buffer chamber 237, it becomes possible to uniformize the difference in flow velocity of the gases in the buffer chamber 237. The gases discharged from each of the plurality of gas supply holes 250b into the buffer chamber 237 are alleviated in particle velocity in the buffer chamber 237 and then discharged from the plurality of gas supply holes 250c into the process chamber 201. When the gases discharged from each of the plurality of gas supply holes 250b into the buffer chamber 237 are discharged from each of the gas supply holes 250c into the process chamber 201, the gases have a uniform flow rate and flow velocity.

As described above, in this embodiment, the gas is transferred though the nozzles 249a and 249b and the buffer chamber 237 disposed in a vertically elongated space of an annular shape (when viewed from the plane), i.e., a cylindrical space, defined by the inner wall of the sidewall of the reaction tube 203 and the end portions (peripheral portions) of the plurality of wafers 200 arranged in the reaction tube 203. Then, the gas is initially discharged into the reaction tube 203 near the wafers 200 through the respective opened gas supply holes 250a to 250c of the nozzles 249a and 249b and the buffer chamber 237. Further, a main flow of the gas in the reaction tube 203 is oriented in a direction parallel to the surfaces of the wafers 200, i.e., a horizontal direction. With this configuration, the gas can be uniformly supplied to the respective wafers 200. This makes it possible to enhance the uniformity of a thickness of a film formed on each of the wafers 200. The gas flowing on the surfaces of the wafers 200, i.e., the residual gas after reaction, flows toward an exhaust port, i.e., an exhaust pipe 231 described later. However, the flow direction of the residual gas is not limited to a vertical direction but may be appropriately determined depending on a position of the exhaust port.

A process gas (precursor gas), for example, a halosilane precursor gas containing a silicon (Si) as a specified element and a halogen element, is supplied from the gas supply pipe 232a into the process chamber 201 through the MFC 241a, the valve 243a, and the nozzle 249a.

The precursor gas refers to a precursor in a gaseous state, for example, a gaseous precursor in a gaseous state under room temperature and a normal pressure (e.g. atmospheric pressure), a gas obtained by vaporizing a liquid precursor in a liquid state under room temperature and a normal pressure, or the like. The halosilane precursor is a silane precursor having a halogen group. The halogen group includes a chloro group, a fluoro group, a bromo group, an iodine group, and the like. That is, the halogen group includes a halogen element such as chlorine (Cl), fluorine (F), bromine (Br), iodine (I), etc. The halosilane precursor may refer to one kind of halogenide. When the term "precursor" is used herein, it may indicate "a precursor in a liquid state," "a precursor (precursor gas) in a gaseous state," or both.

As the halosilane precursor gas, a precursor gas containing, for example, Si and Cl, namely, a chlorosilane precursor gas, may be used. As the chlorosilane precursor gas, for example, a dichlorosilane ($SiH_2Cl_2$, abbreviation: DCS) gas, may be used. The chlorosilane precursor gas acts as an Si source in a film forming process described later. The DCS is in a gaseous state under room temperature and a normal pressure. However, when a liquid precursor in a liquid state under room temperature and a normal pressure is used, like HCDS described later, the liquid precursor may be vaporized by a vaporizing system such as a vaporizer, a bubbler, or the like so as to be supplied as a precursor gas.

A process gas (reaction gas), for example, a nitrogen (N)-containing gas, is supplied from the gas supply pipe 232b into the process chamber 201 through the MFC 241b, the valve 243b, the nozzle 249b, and the buffer chamber 237. As the N-containing gas, for example, a hydrogen nitride-based gas may be used. The hydrogen nitride-based gas may be a substance consisting of only two elements N and H, and acts as a nitriding gas, i.e., an N source, in the film forming process described later. For example, an ammonia ($NH_3$) gas may be used as the hydrogen nitride-based gas.

A cleaning gas (etching gas), for example, a fluorine (F)-based gas, is supplied from the gas supply pipe 232a into the process chamber 201 through the MFC 241a, the valve 243a, and the nozzle 249a. The fluorine-based gas acts as an etchant to remove deposits, in the cleaning process described later. As the fluorine-based gas, for example, a fluorine ($F_2$) gas may be used.

An inert gas, for example, a nitrogen ($N_2$) gas, is supplied from the gas supply pipes 232c and 232d into the process chamber 201 through the MFCs 241c and 241d, the valves 243c, 247c, 243d and 247d, the gas supply pipes 232a and 232b, the nozzles 249a and 249b, and the buffer chamber 237, respectively.

When a precursor gas is supplied from the gas supply pipe 232a, a precursor gas supply system is mainly configured by the gas supply pipe 232a, the MFC 241a, and the valve 243a. It may also be considered that the nozzle 249a is included in the precursor gas supply system. The precursor gas supply system may be referred to as a precursor supply system. When a halosilane precursor gas is supplied from the gas supply pipe 232a, the precursor gas supply system may be referred to as a halosilane precursor gas supply system or a halosilane precursor supply system.

When a reaction gas (reactant) is supplied from the gas supply pipe 232b, a reaction gas supply system (reactant supply system) is mainly configured by the gas supply pipe 232b, the MFC 241b, and the valve 243b. It may be considered that the nozzle 249b and the buffer chamber 237 are included in the reaction gas supply system. When the aforementioned N-containing gas as a reaction gas is supplied, the reaction gas supply system may be referred to as an N-containing gas supply system, a nitriding gas supply system, or a nitriding agent supply system. When a hydrogen nitride-based gas as an N-containing gas is supplied, the reaction gas supply system may be referred to as a hydrogen nitride-based gas supply system or a hydrogen nitride supply system.

When a cleaning gas is supplied from the gas supply pipe 232a, a cleaning gas supply system is mainly configured by the gas supply pipe 232a, the MFC 241a, and the valve 243a. It may be considered that the nozzle 249a is included in the cleaning gas supply system. The cleaning gas supply system may be referred to as an etching gas supply system or a fluorine-based gas supply system.

Further, an inert gas supply system is mainly configured by the gas supply pipes 232c and 232d, the MFCs 241c and 241d, and the valves 243c, 247c, 243d and 247d.

Figure 2:
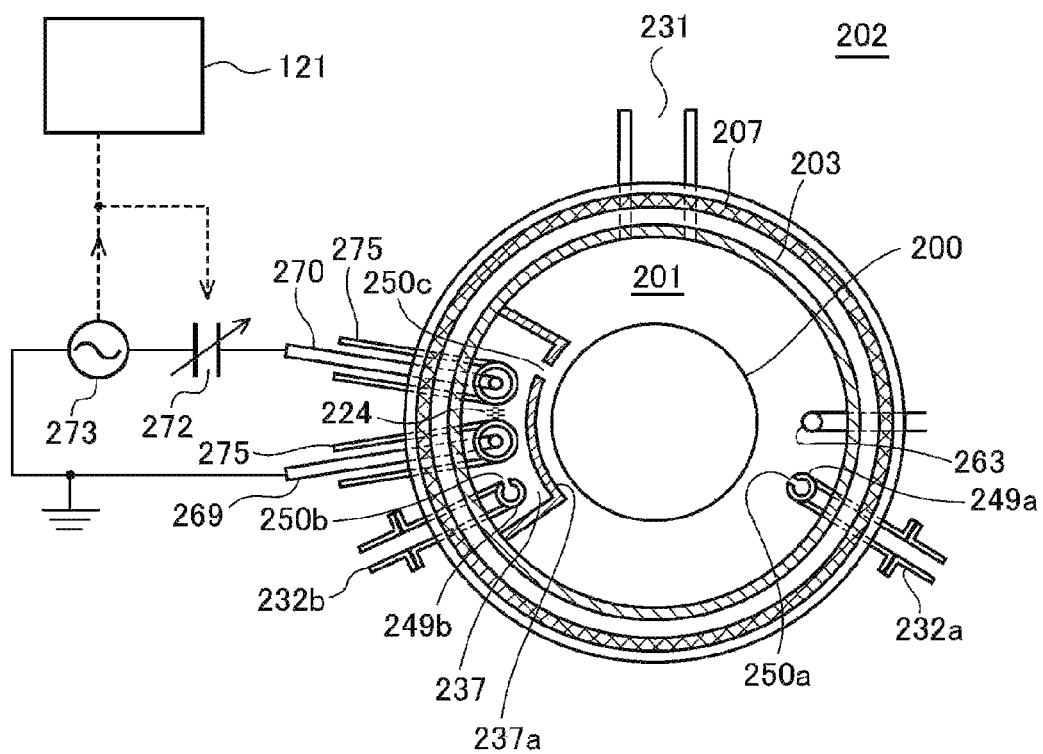
FIG. 2 is a schematic configuration view of the vertical processing furnace of the substrate processing apparatus appropriately used in one embodiment of the present disclosure, in which the processing furnace part is illustrated in a cross-sectional view taken along line II-II of FIG. 1.
Figure 3:
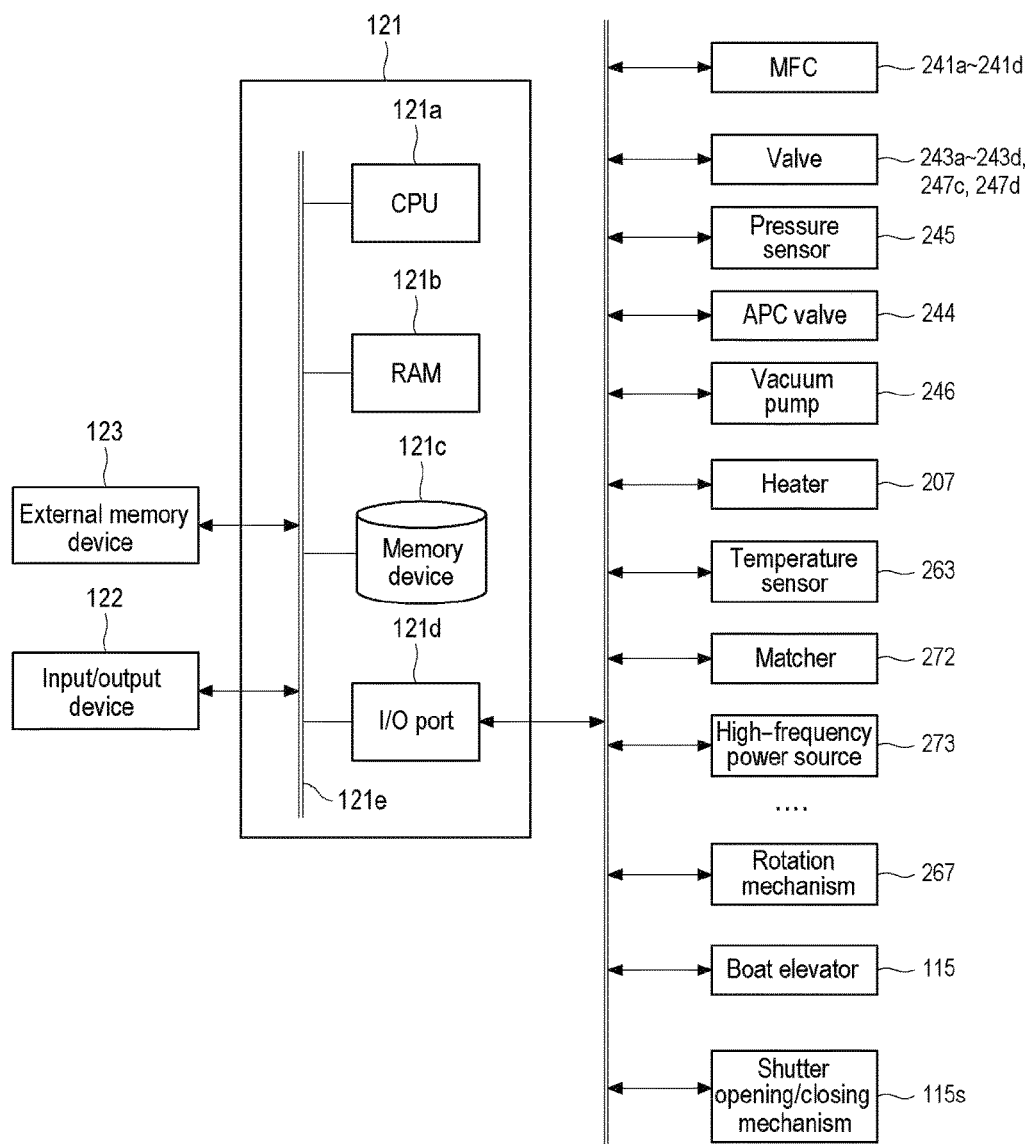
FIG. 3 is a schematic configuration view of a controller of the substrate processing apparatus appropriately used in one embodiment of the present disclosure, in which a control system of the controller is illustrated in a block diagram.

As illustrated in FIG. 2, two bar-shaped electrodes 269 and 270 formed of a conductor and having an elongated structure are disposed in the buffer chamber 237 along an arrangement direction of the wafer 200 in the upper portion of the reaction tube 203, rather than the lower portion thereof. Each of the bar-shaped electrodes 269 and 270 is installed to be parallel to the nozzle 249b. Each of the bar-shaped electrodes 269 and 270 is covered by an electrode protection tube 275 in a lower portion rather than an upper portion so as to be protected. Any one of the bar-shaped electrodes 269 and 270 is connected to a high-frequency power source 273 through a matcher 272 while the other is connected to a ground as a reference potential. By applying a high-frequency (RF) power between the bar-shaped electrodes 269 and 270 from the high-frequency power source 273, plasma is generated in a plasma generation region 224 between the bar-shaped electrodes 269 and 270. A plasma source as a plasma generator (plasma generating part) is mainly configured by the bar-shaped electrodes 269 and 270 and the electrode protection tubes 275. It may also be considered that the matcher 272 and the high-frequency power source 273 are included in the plasma source. As described later, the plasma source serves as a plasma exciting part (activation mechanism) for plasma-exciting a gas, that is, exciting (activating) a gas to a plasma state.

The electrode protection tubes 275 have a structure that can insert each of the bar-shaped electrodes 269 and 270 into the buffer chamber 237 in a state where the bar-shaped electrodes 269 and 270 are separated from an internal atmosphere of the buffer chamber 237. When an oxygen (O) concentration in the electrode protection tubes 275 is about equal to an O concentration of ambient air (atmosphere), each of the bar-shaped electrodes 269 and 270 inserted into the electrode protection tubes 275 is thermally oxidized by the heater 207. By filling the interior of the electrode protection tubes 275 with an inert gas such as an $N_2$ gas, etc. or by purging the interior of the electrode protection tubes 275 with an inert gas such as an $N_2$ gas, etc. using an inert gas purge mechanism, the O concentration in the electrode protection tubes 275 can be reduced to prevent oxidation of the bar-shaped electrodes 269 and 270.

The exhaust pipe 231 as an exhaust passage for exhausting an internal atmosphere of the process chamber 201 is installed in the reaction tube 203. A vacuum pump 246 serving as a vacuum exhaust device are connected to the exhaust pipe 231 via a pressures sensor 245, which is a pressure detector (pressure detecting part) for detecting an internal pressure of the process chamber 201, and an auto pressure controller (APC) valve 244, which is an exhaust valve (pressure regulating part). The APC valve 244 is configured to perform/stop vacuum exhaust the interior of the process chamber 201 by opening/closing the valve with the vacuum pump 246 actuated, and also configured to regulate the internal pressure of the process chamber 201 by adjusting an opening degree of the valve based on the pressure information detected by the pressure sensor 245 while keeping the vacuum pump 246 actuated. An exhaust system is mainly configured by the exhaust pipe 231, the APC valve 244, and the pressure sensor 245. It may be considered that the vacuum pump 246 is included in the exhaust system. The exhaust pipe 231 is not limited to the case where it is installed in the reaction tube 203 but may be installed in the manifold 209 in a similar manner to the nozzles 249a and 249b.

A seal cap 219, which serves as a furnace port cover configured to hermetically seal a lower end opening of the manifold 209, is installed under the manifold 209. The seal cap 219 is configured to make contact with the lower end of the manifold 209 at the lower side in the vertical direction. The seal cap 219 is formed of a metal such as, for example, SUS, etc. and has a disc shape. An O-ring 220b, which is a seal member making contact with the lower end portion of the manifold 209, is installed on an upper surface of the seal cap 219. A rotation mechanism 267 configured to rotate the boat 217 to be described later is installed at an opposite side of the seal cap 219 from the process chamber 201. A rotary shaft 255 of the rotation mechanism 267, which passes through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevation mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) that transfers the boat 217, i.e., the wafers 200, into and out of the process chamber 201. In addition, a shutter 219s, which serves as a furnace port cover configured to hermetically seal the lower end opening of the manifold 209, is installed under the manifold 209 while the seal cap 219 is lowered by the boat elevator 115. The shutter 219s is formed of a metal such as, for example, SUS, etc. and has a disc shape. An O-ring 220c, which is a seal member making contact with the lower end portion of the manifold 209, is installed on an upper surface of the shutter 219s. The opening/closing operation (elevation operation, rotation operation, or the like) of the shutter 219s is controlled by a shutter opening/closing mechanism 115s.

The boat 217 as a substrate support is configured to support a plurality of, e.g., 25 to 200 wafers, in a manner such that the wafers 200 are horizontally stacked in a vertical direction and multiple stages, i.e., being separated from each other, with the centers of the wafers 200 aligned with one another. The boat 217 is formed of a heat resistant material such as, for example, quartz, SiC, or the like. Heat insulating plates 218 formed of a heat resistant material such as, for example, quartz, SiC, or the like are supported below the boat 217 in a multi-stage manner. With this configuration, the heat generated from the heater 207 is hardly transferred to the seal cap 219. However, this embodiment is not limited thereto. Instead of installing the heat insulating plates 218 below the boat 217, for example, a heat insulating tube as a tubular member formed of a heat resistant material such as quartz, SiC, or the like may be installed below the boat 217.

A temperature sensor 263, which is a temperature detector, is installed in the reaction tube 203. Based on the temperature information detected by the temperature sensor 263, the state of current being applied to the heater 207 is adjusted such that the interior of the process chamber 201 has a desired temperature distribution. Similar to the nozzles 249a and 249b, the temperature sensor 263 is configured to have an L shape, and is installed along the inner wall of the reaction tube 203. As illustrated in FIG. 3, a controller 121, which is a control part (control means), is configured as a computer including a central processing unit (CPU) 121a, a random access memory (RAM) 121b, a memory device 121c, an I/O port 121d, etc. The RAM 121b, the memory device 121c, and the I/O port 121d are configured to exchange data with the CPU 121a via an internal bus 121e. An input/output device 122 configured as, for example, a touch panel or the like is connected to the controller 121.

The memory device 121c is configured by, for example, a flash memory, a hard disk drive (HDD), or the like. A control program for controlling the operations of the substrate processing apparatus, a process recipe in which the sequences, conditions, or the like of the substrate processing described later are written, a cleaning recipe in which the sequences, conditions, or the like of the cleaning process described later are written, and the like are readably stored in the memory device 121c. The process recipe, which is a combination of sequences, causes the controller 121 to execute each sequence in the film forming process described later in order to obtain a predetermined result, and functions as a program. The cleaning recipe, which is a combination of sequences, causes the controller 121 to execute each sequence in the cleaning process described later in order to obtain a predetermined result, and functions as a program. Hereinafter, the program recipe, the cleaning recipe, the control program, or the like may be generally referred to simply as a program. Also, the process recipe or the cleaning recipe will be simply referred to as a recipe. When the term "program" is used herein, it is intended to encompass only the process recipe, only the cleaning recipe, only the control program, or any combination of them. The RAM 121b is configured as a memory area (work area) in which a program, data, or the like read by the CPU 121a is temporarily stored.

The I/O port 121d is connected to the MFCs 241a to 241d, the valves 243a to 243d, 247c, and 247d, the pressure sensor 245, the APC valve 244, the vacuum pump 246, the temperature sensor 263, the heater 207, the rotation mechanism 267, the boat elevator 115, the shutter opening/closing mechanism 115s, the matcher 272, the high-frequency power source 273, and the like as described above.

The CPU 121a is configured to read and execute the control program from the memory device 121c, and also to read the recipe from the memory device 121c as an operation command is input from the input/output device 122. The CPU 121a is configured to, according to the contents of the read recipe, control a flow rate adjusting operation of various kinds of gases by the MFCs 241a to 241d, an opening/closing operation of the valves 243a to 243d, 247c, and 247d, an opening/closing operation of the APC valve 244, a pressure regulating operation by the APC valve 244 based on the pressure sensor 245, a start/stop operation of the vacuum pump 246, a temperature adjusting operation of the heater 207 based on the temperature sensor 263, a rotation operation and a rotation speed adjusting operation of the boat 217 by the rotation mechanism 267, an operation of moving the boat 217 up and down by the boat elevator 115, an opening/closing operation of the shutter 219s by the shutter opening/closing mechanism 115s, an impedance adjusting operation by the matcher 272, an operation of supplying electric power to the high-frequency power source 273, and the like.

The controller 121 may be configured by installing, on a computer, the aforementioned program, which is stored in an external memory device 123 (for example, a magnetic tape; a magnetic disc such as a flexible disc or a hard disc, or the like; an optical disc such as a compact disc (CD), a digital versatile disc (DVD), or the like; an optical magnetic disk such as a magneto-optical (MO) disc, etc.; or a semiconductor memory such as a universal serial bus (USB) memory, a memory card, etc.). The memory device 121c or the external memory device 123 is configured as a non-transitory computer-readable recording medium. Hereinafter, they will be generally referred to simply as "a recording medium." When the term "recording medium" is used herein, it is intended to encompass only the memory device 121c, only the external memory device 123, or both. Also, the program may be supplied to the computer through the use of a communication means such as the Internet or a dedicated line, without having to go through the external memory device 123.

(2) Film Forming Process

An example of a sequence of forming a film on a substrate, which is one of the processes of manufacturing a semiconductor device using the aforementioned substrate processing apparatus, will be described with reference to FIG. 4. In the following description, the operations of the respective parts constituting the substrate processing apparatus are controlled by the controller 121.

Figure 4:
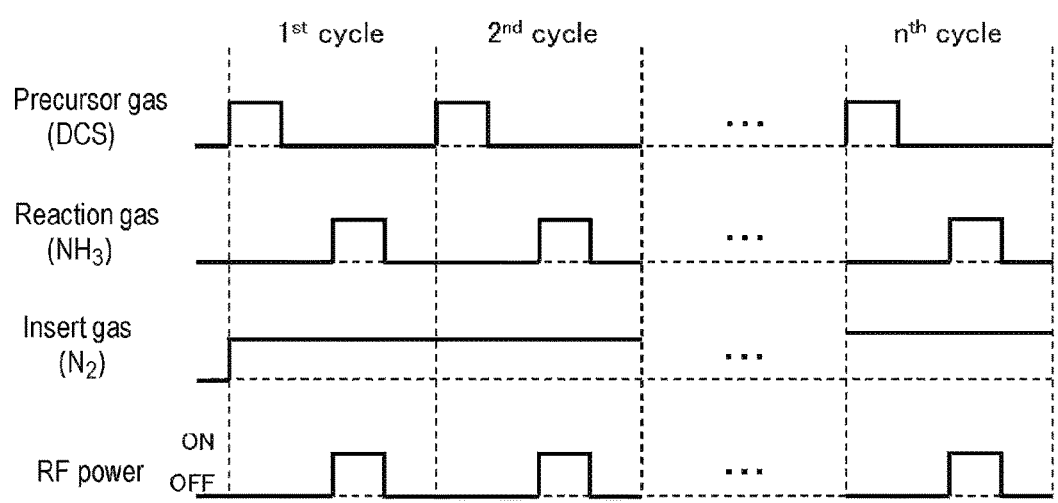
FIG. 4 is a view illustrating a film forming sequence according to one embodiment of the present disclosure.

In a film forming sequence illustrated in FIG. 4, a cycle of performing step 1 of supplying a DCS gas as a precursor gas to the wafer 200 as a substrate and step 2 of supplying an NH$_3$ gas excited by plasma as a reaction gas to the wafer 200 non-simultaneously, i.e., asynchronously, is performed a predetermined number of times (n times) to form a silicon nitride film (SiN film) as a film containing Si and N on the wafer 200.

In the present disclosure, the aforementioned film forming process may be expressed as follows for the convenience of description. The same marks will also be used in the description of the following modifications or other embodiments.

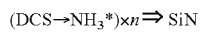

$(DCS \rightarrow NH_3^*) \times n \Rightarrow SiN$

When the term "wafer" is used herein, it should be understood as either a "wafer per se," or "the wafer and a laminated body (aggregate) of certain layers or films formed on a surface of the wafer," i.e., certain layers or films formed on the surface of the wafer is collectively referred to as a wafer. Also, when the term "surface of a wafer" is used herein, it should be understood as either a "surface (exposed surface) of a wafer per se," or a "surface of a certain layer or film formed on the wafer, i.e., an outermost surface of the wafer as a laminated body."

Thus, in the present disclosure, the expression "a specified gas is supplied to a wafer" may indicate that "the specified gas is directly supplied to a surface (exposed surface) of a wafer per se," or that "the specified gas is supplied to a surface of a certain layer, film, etc. formed on the wafer, i.e., to an outermost surface of the wafer as a laminated body." Also, in the present disclosure, the expression "a certain layer (or film) is formed on a wafer" may indicate that "the certain layer (or film) is directly formed on the surface (exposed surface) of the wafer per se," or that "the certain layer (or film) is formed on the surface of a certain layer or film formed on the wafer, i.e., on an outermost surface of the wafer as a laminated body."

Also, in the present disclosure, the term "substrate" is interchangeably used with the term "wafer."

(Wafer Loading Step)

When a plurality of wafers 200 are charged on the boat 217 (wafer charging), the shutter 219s is moved by the shutter opening/closing mechanism 115s and the lower end opening of the manifold 209 is opened (shutter open). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

(Pressure and Temperature Adjustment Step)

Vacuum exhaust (decompression exhaust) is performed by the vacuum pump 246 such that the internal pressure of the process chamber 201, i.e., the pressure of a space where the wafers 200 exist, becomes equal to a desired pressure (vacuum level). At this time, the internal pressure of the process chamber 201 is measured by the pressure sensor 245, and the APC valve 244 is feedback-controlled based on the measured pressure information. The vacuum pump 246 remains activated at least until the processing of the wafers 200 is completed. Further, the wafers 200 in the process chamber 201 are heated by the heater 207 to have a desired temperature (first temperature). At this time, the state of current being applied to the heater 207 is feedback-controlled based on the temperature information detected by the temperature sensor 263 such that the interior of the process chamber 201 has a desired temperature distribution. The heating of the interior of the process chamber 201 by the heater 207 is continuously performed at least until the processing of the wafers 200 is completed. Subsequently, the boat 217 and wafers 200 begin to be rotated by the rotation mechanism 267. The rotation of the boat 217 and wafers 200 by the rotation mechanism 267 is continuously performed at least until the processing of the wafers 200 is completed.

(Film Forming Step)

Thereafter, the following two steps, i.e., steps 1 and 2, are sequentially performed.

[Step 1]

At this step, a DCS gas is supplied to the wafers 200 in the process chamber 201.

Specifically, the valve 243a is opened to cause the DCS gas to flow into the gas supply pipe 232a. A flow rate of the DCS gas is adjusted by the MFC 241a, and the flow rate-adjusted DCS gas is supplied into the process chamber 201 through the nozzle 249a and then exhausted through the exhaust pipe 231. At this time, the DCS gas is supplied to the wafers 200. At the same time, the valves 243c and 247c are opened to cause an $N_2$ gas to flow into the gas supply pipe 232c. A flow rate of the $N_2$ gas is adjusted by the MFC 241c, and the flow rate-adjusted $N_2$ gas is supplied into the process chamber 201 together with the DCS gas and then exhausted through the exhaust pipe 231.

Further, in order to prevent infiltration of the DCS gas into the buffer chamber 237, the valves 243d and 247d are opened to cause the $N_2$ gas to flow into the gas supply pipe 232d. The $N_2$ gas is supplied into the process chamber 201 through the gas supply pipe 232b, the nozzle 249b, and the buffer chamber 237, and then exhausted through the exhaust pipe 231.

At this time, the APC valve 244 is appropriately adjusted such that the internal pressure of the process chamber 201 falls within a range of, e.g., 1 to 2666 Pa, preferably, 67 to 1333 Pa. A supply flow rate of the DCS gas controlled by the MFC 241a is set to fall within a range of, e.g., 1 to 2000 sccm, preferably, 10 to 1000 sccm. Supply flow rates of the $N_2$ gas controlled by the MFCs 241c and 241d are set to fall within a range of, e.g., 100 to 10000 sccm, respectively. A time period during which the DCS gas is supplied to the wafer 200 is set to fall within a range of, e.g., 1 to 120 seconds, preferably, 1 to 60 seconds. The temperature of the heater 207 is set such that the temperature of the wafer 200 becomes equal to a temperature (first temperature) within a range of, e.g., 300 to 700 degrees C., preferably, 300 to 650 degrees C., more preferably, 350 to 600 degrees C.

When the temperature of the wafer 200 is less than 300 degrees C., a practical deposition rate may not be obtained because the DCS is hardly chemisorbed onto the wafer 200. This may be solved by setting the temperature of the wafer 200 at 300 degrees C. or higher. By setting the temperature of the wafer 200 at 300 degrees C. or higher, further, 350 degrees C. or higher, it becomes possible to further sufficiently adsorb the DCS onto the wafer 200 and to obtain a further sufficient deposition rate.

When the temperature of the wafer 200 exceeds 700 degrees C., an excessive vapor phase reaction occurs to degrade the film thickness uniformity, making it difficult to control the film thickness uniformity. By setting the temperature of the wafer at 700 degrees C. or less, namely by causing an appropriate vapor phase reaction to occur, such degradation of the film thickness uniformity can be suppressed, and it becomes possible to control the film thickness uniformity. In particular, by setting the temperature of the wafer 200 at 650 degrees C. or less, it becomes possible to avoid a state where the vapor phase reaction becomes dominant. Further, by setting the temperature of the wafer at 600 degrees C. or less, the surface reaction becomes more dominant than the vapor phase reaction. This makes it easy to assure the film thickness uniformity and to control the film thickness uniformity.

Thus, the temperature of the wafer 200 is preferably set to fall within a range of 300 to 700 degrees C., preferably, 300 to 650 degrees C., more preferably, 350 to 600 degrees C.

By supplying the DCS gas to the wafer 200 under the aforementioned conditions, a first layer (initial layer), for example, an Si-containing layer containing Cl having a thickness of less than one atomic layer to several atomic layers is formed on an outermost surface of the wafer 200. The Si-containing layer containing Cl may be an Si layer containing Cl or an adsorption layer of DCS, or may include both. The adsorption layer of DCS may be a physical adsorption layer of DCS or a chemical adsorption layer of DCS, or may include both. Here, the layer having a thickness of less than one atomic layer refers to a discontinuously formed atomic layer, and the layer having a thickness of one atomic layer refers to a continuously formed atomic layer.

After the first layer is formed, the valve 243a is closed to stop the supply of the DCS gas. At this time, the APC valve 244 is kept opened and the interior of the process chamber 201 is vacuum-exhausted by the vacuum pump 246, whereby the unreacted DCS gas or the DCS gas contributing to the formation of the first layer, which remains in the process chamber 201, is removed from the interior of the process chamber 201. At this time, the valves 243c, 247c, 243d and 247d are kept opened and the supply of the $N_2$ gas into the process chamber 201 is maintained. The $N_2$ gas serves as a purge gas. Thus, the gas remaining in the process chamber 201 can be effectively removed from the process chamber 201.

At this time, the gas remaining in the process chamber 201 may not be completely removed and the interior of the process chamber 201 may not be completely purged. If the gas remaining in the process chamber 201 is small in amount, no adverse effect is generated at step 2 performed thereafter. The flow rate of the $N_2$ gas supplied into the process chamber 201 also need not be a large flow rate. For example, by supplying the $N_2$ gas in an amount equal to the volume of the reaction tube 203 (or the process chamber 201), it is possible to perform the purge in such a way that no adverse effect is generated at step 2. Inasmuch as the interior of the process chamber 201 is not completely purged as mentioned above, it becomes possible to shorten the purge time and to improve the throughput. It also becomes possible to reduce the consumption of the $N_2$ gas to a necessary minimum level.

As the precursor gas, it may be possible to use not only the DCS gas but also a halosilane precursor gas such as, for example, a monochlorosilane ($SiH_3Cl$, abbreviation: MCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, or an octachlorotrisilane ($Si_3Cl_8$, abbreviation: OCTS) gas. Also, as the precursor gas, it may be possible to use an aminosilane precursor gas such as, for example, tetrakisdimethylaminosilane ($Si[N(CH_3)_2]_4$, abbreviation: 4DMAS) gas, a trisdimethylamonisilane ($Si[N(CH_3)_2]_3H$, abbreviation: 3DMAS) gas, a bisdiethylaminosilane ($Si[N(C_2H_5)_2]_2H_2$, abbreviation: BDEAS) gas, a bis tert-butylaminosilane($SiH_2[NH(C_4H_9)]_2$, abbreviation: BTBAS) gas, a diisopropylaminosilane ($SiH_3N[CH(CH_3)_2]_2$, abbreviation: DIPAS) gas, or the like.

As the inert gas, it may be possible to use not only the $N_2$ gas but also a rare gas such as, for example, an Ar gas, an He gas, an Ne gas, a Xe gas, or the like.

[Step 2]

After step 1 is completed, an $NH_3$ gas excited by plasma is supplied to the wafer 200 in the process chamber 201.

At this step, the opening/closing control of the valves 243b, 243c, 247c, 243d, and 247d is performed in the same manner as that of the valves 243a, 243c, 247c, 243d, and 247d performed at step 1. The flow rate of the $NH_3$ gas is adjusted by the MFC 241b, and the flow rate-adjusted $NH_3$ gas is supplied into the process chamber 201 through the nozzle 249b and the buffer chamber 237 and then exhausted through the exhaust pipe 231. At this time, the $NH_3$ gas is supplied to the wafer 200.

The supply flow rate of the $NH_3$ gas controlled by the MFC 241b is set to fall within a range of, e.g., 100 to 10000 sccm. The RF power applied between bar-shaped electrodes 269 and 270 is set to fall within a range of, e.g., 50 to 1000 W. The internal pressure of the process chamber 201 is set to fall within a range of, e.g., 1 to 100 Pa. A time period during which active species ($NH_3$*) obtained by plasma-exciting the $NH_3$ gas are supplied to the wafer 200 is set to fall within a range of, e.g., 1 to 120 seconds, preferably, 1 to 60 seconds. Other processing conditions may be the same as those used at step 1 above.

At this time, the gas flowing in the process chamber 201 is the $NH_3$ gas activated by plasma, and a DCS gas is not flowed in the process chamber 201. Thus, the $NH_3$ gas does not cause a gas phase reaction and is supplied in an activated state to the wafer 200. The $NH_3$ gas supplied to the wafer 200 reacts with at least a portion of the first layer formed on the wafer 200 at step 1. Accordingly, the first layer is nitrated by the plasma-excited $NH_3$ gas so as to be changed (modified) to a silicon nitride layer (SiN layer) containing Si and N as a second layer.

After the second layer is formed, the valve 243b is closed to stop the supply of the $NH_3$ gas. Then, the unreacted $NH_3$ gas, the $NH_3$ gas contributed to the formation of the second layer, or the reaction byproduct, which remains in the process chamber 201, is removed from the interior of the process chamber 201 by the same processing procedures as those used at step 1. At this time, similar to step 1, the gas or the like which remains in the process chamber 201 may not be completely removed.

As the N-containing gas, it may be possible to use not only the $NH_3$ gas but also a hydrogen nitride-based gas such as a diazene ($N_2H_2$) gas, a hydrazine ($N_2H_4$) gas, an $N_3H_8$ gas, etc. Also, as the N-containing gas, it may be possible to use not only these gases but also a gas containing amine, i.e., an amine-based gas. As the amine-based gas, it may be possible to use a monomethylamine ($CH_3NH_2$, abbreviation: MMA) gas, a dimethylamine (($CH_3)_2NH$, abbreviation: DMA) gas, a trimethylamine (($CH_3)_3N$, abbreviation: TMA) gas, a monoethylamine ($C_2H_5NH_2$, abbreviation: MEA) gas, a diethylamine (($C_2H_5)_2NH$, abbreviation: DEA) gas, a triethylamine (($C_2H_5)_3N$, abbreviation: TEA) gas, or the like. Also, as the N-containing gas, it may be possible to use a gas containing an organic hydrazine compound, i.e., an organic hydrazine-based gas. As the organic hydrazine-based gas, it may be possible to use a monomethylhydrazine (($CH_3)HN_2H_2$, abbreviation: MMH) gas, a dimethylhydrazine (($CH_3)_2N_2H_2$, abbreviation: DMH) gas, a trimethylhydrazine (($CH_3)_2N_2(CH_3)H$, abbreviation: TMH) gas, or the like.

As the inert gas, it may be possible to use not only the $N_2$ gas but also, for example, the aforementioned rare gas.

[Performing Predetermined Number of Times]

By performing a cycle of alternately performing the aforementioned steps 1 and 2 non-simultaneously, i.e., asynchronously, a predetermined number of times (n times), an SiN film is formed on the wafer 200. This cycle is preferably repeated a plurality of times. That is to say, it is preferred that the thickness of the second layer formed per cycle is set to be smaller than a desired film thickness and the aforementioned cycle is repeated a plurality of times until the thickness of the SiN film formed by laminating the second layer becomes equal to a desired film thickness.

(After Purge Step and Atmosphere Returning Step)

After the film forming step is completed, an $N_2$ gas is supplied into the process chamber 201 from each of the gas supply pipes 232c and 232d and then exhausted through the exhaust pipe 231. The $N_2$ gas serves as a purge gas. Thus, the interior of the process chamber 201 is purged and the residual gas or the reaction byproduct remaining in the process chamber 201 is removed from the interior of the process chamber 201 (after purge). Thereafter, the internal atmosphere of the process chamber 201 is substituted with an inert gas (inert gas substitution), and the internal pressure of the process chamber 201 returns to a normal pressure (return to atmospheric pressure).

(Wafer Unloading Step)

Thereafter, the seal cap 219 is moved down by the boat elevator 115 and the lower end of the manifold 209 is opened. The processed wafer 200 supported by the boat 217 is unloaded from the lower end of the manifold 209 to the outside of the reaction tube 203 (boat unloading). After the boat 217 is unloaded, the shutter 219s is moved and the lower end opening of the manifold 209 is sealed by the shutter 219s through the O-ring 220c (shutter close). The processed wafer 200 is unloaded to the outside of the reaction tube 203 and then discharged from the boat 217 (wafer discharge).

(3) Cleaning Process

When the aforementioned film forming process is performed, deposits including a thin film such as an SiN film, etc. are accumulated on a surface of a member within the process chamber 201, for example, an inner wall of the reaction tube 203, a surface of the nozzle 249a, a surface of the partition wall 237a, a surface of the boat 217, or the like. That is to say, the deposits containing N adhere to and is accumulated on the surface of the member within the heated process chamber 201. Thus, the cleaning process is performed at a time the amount of deposits, i.e., a thickness of the accumulated film, reaches a predetermined amount (thickness) prior to the occurrence of delamination or fall on the deposits.

The cleaning process is performed by supplying a fluorine-based gas, for example, an $F_2$ gas, into the process chamber 201. Hereinafter, an example of the cleaning process in this embodiment will be described with reference to FIG. 5. In the following description, the operation of each of the parts constituting the substrate processing apparatus is controlled by the controller 121.

(Boat Loading Step)

The shutter 219s is moved by the shutter opening/closing mechanism 115s and the lower end opening of the manifold 209 is opened (shutter open). Thereafter, the empty boat 217, i.e., the boat 217 that is not loaded with the wafers 200, is lifted up by the boat elevator 115 to be loaded into the process chamber 201 (boat loading). In this state, the seal cap 219 seals the lower end of the manifold 209 via the O-ring 220b.

(Pressure and Temperature Adjustment Step)

Vacuum exhaust is performed by the vacuum pump 246 such that the internal pressure of the process chamber 201 becomes equal to a desired pressure. The vacuum pump 246 remains activated at least until the cleaning process is completed. Further, the interior of the process chamber 201 is heated by the heater 207 to have a desired temperature (second temperature). For example, the second temperature may be equal to or lower than the first temperature. Here, an example of setting the second temperature at a temperature lower than the first temperature, namely an example of changing (lowering) the internal temperature of the process chamber 201 from the first temperature to the second temperature will be described. Further, the boat 217 begins to be rotated by the rotation mechanism 267. The heating of the interior of the process chamber 201 by the heater 207 and the rotation of the boat 217 are continuously performed at least until the cleaning process is completed. However, the boat 217 may be not rotated.

(Gas Cleaning Step)

At this step, an $F_2$ gas is supplied into the process chamber 201 after the film forming process is performed, that is, into the process chamber 201 to which the deposits adhere.

At this step, the opening/closing control of the valves 243a, 243c, 247c, 243d, and 247d is performed in the same order as that of the valves 243a, 243c, 247c, 243d, and 247d of step 1 of the film forming process. The $F_2$ gas is adjusted in flow rate by the WC 241a and supplied into the process chamber 201 through the gas supply pipe 232a and the nozzle 249a. By causing the $N_2$ gas to flow from the gas supply pipe 232c, the $F_2$ gas can be diluted in the gas supply pipe 232a to control a concentration of the $F_2$ gas supplied into the process chamber 201. By causing the $N_2$ gas to flow from the gas supply pipe 232d, it is possible to prevent infiltration of the $F_2$ gas into the buffer chamber 237. At this time, a hydrogen fluoride (HF) gas, a hydrogen ($H_2$) gas, a nitrogen monoxide (NO) gas, or the like may be added to the $F_2$ gas.

At this time, the APC valve 244 is appropriately adjusted such that the internal pressure of the process chamber 201 falls within a range of, e.g., 1330 to 101300 Pa, preferably, 13300 to 53320 Pa. A supply flow rate of the $F_2$ gas controlled by the WC 241a is set to fall within a range of, e.g., 500 to 5000 sccm. Supply flow rates of the $N_2$ gas controlled by the MFCs 241c and 241d are set to fall within a range of, e.g., 100 to 10000 sccm, respectively. A time period during which the $F_2$ gas is supplied into the process chamber 201 is set to fall within a range of, e.g., 60 to 1800 seconds, preferably, 120 to 1200 seconds. The temperature of the heater 207 is set such that the internal temperature of the process chamber 201 becomes equal to a temperature (second temperature) within a range of, e.g., 200 to 450 degrees C., preferably, 200 to 400 degrees C.

When the internal temperature of the process chamber 201 is less than 200 degrees C., an etching reaction of deposits may not be performed. By setting the internal temperature of the process chamber 201 at 200 degrees C. or higher, it becomes possible to perform an etching reaction of deposits.

When the internal temperature of the process chamber 201 exceeds 450 degrees C., an excessive etching reaction may occur such that the member within the process chamber 201 may be damaged. By setting the internal temperature of the process chamber 201 at 450 degrees C. or less, the etching reaction can be appropriately suppressed to avoid the member within the process chamber 201 from being damaged. By setting the internal temperature of the process chamber 201 at 400 degrees C. or less, the etching reaction may be more appropriately suppressed to avoid the member within the process chamber 201 from being damaged.

Thus, it is preferred that the internal temperature of the process chamber 201 is set to fall within a range of 200 to 450 degrees C., preferably, 200 to 400 degrees C.

By supplying the $F_2$ gas into the process chamber 201 under the aforementioned conditions, the deposits adhered to the surface of the member within the process chamber 201 are removed. That is to say, the deposits adhered to the inner wall of the reaction tube 203, the surface of the nozzle 249a, the surface of the partition wall 237a, the surface of the boat 217, or the like are removed by an etching reaction (thermochemical reaction) with the $F_2$ gas.

Figure 5:
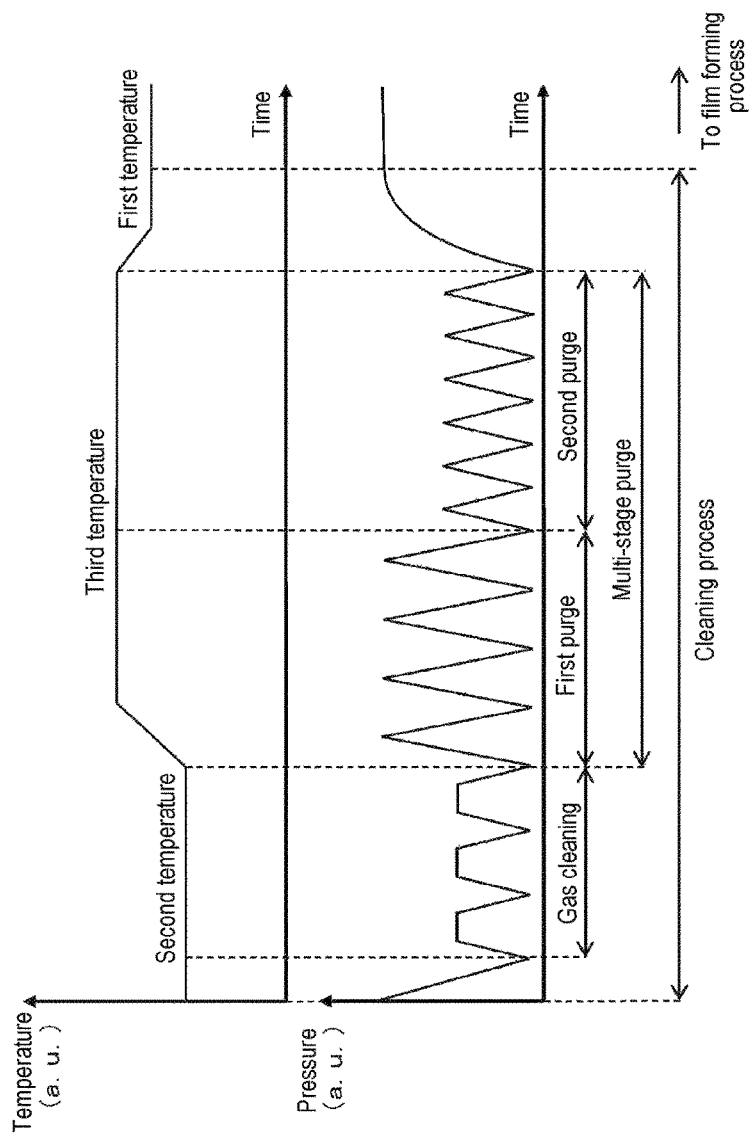
FIG. 5 is a view illustrating a cleaning sequence according to one embodiment of the present disclosure.

The $F_2$ gas may be continuously or intermittently supplied into the process chamber 201. When the $F_2$ gas is intermittently supplied into the process chamber 201, the $F_2$ gas may be filled in the process chamber 201. By intermittently supplying the $F_2$ gas into the process chamber 201, an amount of byproduct such as an ammonium fluoride ($NH_4F$), tetrafluorosilane ($SiF_4$), or the like in the process chamber 201 can be appropriately controlled to make it possible to prepare an environment in which the etching reaction is easily made. Further, by intermittently supplying the $F_2$ gas, an internal pressure of the process chamber 201 can be changed to give an impact by the pressure change to the deposits. Accordingly, the deposits may be cracked or delaminated to effectively perform etching on the deposits. Also, by intermittently supplying the $F_2$ gas, a usage amount of the $F_2$ gas can be appropriately suppressed such that the costs for the cleaning process can be reduced. FIG. 5 illustrates an example in which pressure in the process chamber 201 is changed by intermittently supplying the $F_2$ gas into the process chamber 201.

As the cleaning gas, it may be possible to use not only the $F_2$ gas but also a fluoride-based gas such as a chlorine fluoride ($ClF_3$) gas, a nitrogen fluoride ($NF_3$) gas, an HF gas, an $F_2$ gas+an HF gas, a $ClF_3$ gas+an HF gas, an $NF_3$ gas+an HF gas, an $F_2$ gas+an $H_2$ gas, a $ClF_3$ gas+an $H_2$ gas, an $NF_3$ gas+an $H_2$ gas, an $F_2$ gas+an NO gas, a $ClF_3$ gas+an NO gas, an $NF_3$ gas+an NO gas, or the like.

As the inert gas, it may be possible to use not only the $N_2$ gas but also, for example, the rare gas described above.

(Temperature Rising Step)

When the gas cleaning step is completed, the valve 243a is closed to stop the supply of the $F_2$ gas into the process chamber 201. Then, the interior of the process chamber 201 is heated by the heater 207 such that the interior of the process chamber 201 has a desired temperature (third temperature). For example, the third temperature may be a temperature higher than the second temperature. Here, an example in which the third temperature is set to a temperature higher than the second temperature, that is, an example in which the internal temperature of the process chamber 201 is changed from the second temperature to the third temperature (temperature rising), will be described. The heating of the interior of the process chamber 201 by the heater 207 is continuously performed until a multi-stage purge step described later is completed.

Preferably, the third temperature is set to a temperature higher than the internal temperature (second temperature) of the process chamber 201 of the gas cleaning step (third temperature>second temperature). By heating the interior of the process chamber 201 to have such a temperature, it becomes possible to promote elimination of a very small compound (about a few A) of a solid (hereinafter, referred to as a residual compound) generated due to the reaction between the particle (foreign object) source from the surface of the member within the process chamber 201 (e.g., the deposits) and the cleaning gas. It is considered that this is because the residual compound such as $NH_4F$, etc. is easily sublimated by heating the interior of the process chamber 201 as mentioned above. As a result, it becomes possible to promote removal of the residual compound from the interior of the process chamber 201, the interior of the nozzles 249a and 249b, the interior of the buffer chamber 237, etc., at the multi-stage purge step described later.

Further, preferably, the third temperature is set to a temperature equal to or higher than the temperature (first temperature) of the wafer 200 in the film forming step (third temperature>first temperature), more preferably, the third temperature is set to a temperature higher than the first temperature (third temperature>first temperature). By heating the interior of the process chamber 201 to have such a temperature, it becomes possible to further promote sublimation of the residual compound to further promote elimination of the residual compound from the surface of the member within the process chamber 201. As a result, it becomes possible to further promote removal of the residual compound from the interior of the process chamber 201, from the interior of the nozzles 249a and 249b, and from the interior of the buffer chamber 237 at the multi-stage purge step described later.

The temperature of the heater 207 is set such that the internal temperature of the process chamber 201 satisfies the aforementioned conditions, and becomes equal to a temperature (third temperature) within a range of, for example, 400 to 630 degrees C., preferably, 550 to 620 degrees C.

When the internal temperature of the process chamber 201 is lower than 400 degrees C., it becomes difficult to sublimate the residual compound such that the removal efficiency of the residual compound may degrade at the multi-stage purge step. By setting the internal temperature of the process chamber 201 at 400 degrees C. or higher, it becomes possible to promote the sublimation of the residual compound and increase the removal efficiency of the residual compound at the multi-stage purge step. By setting the internal temperature of the process chamber 201 at 550 degrees C. or higher, it becomes possible to further promote the sublimation of the residual compound and further increase the removal efficiency of the residual compound at the multi-stage purge step.

When the internal temperature of the process chamber 201 exceeds 630 degrees C., the time required for lowering the internal temperature of the process chamber 201 performed after the multi-stage purge step may be lengthened, thereby degrading the entire efficiency of the cleaning process. Further, the member within the process chamber 201 may be damaged by heat. By setting the internal temperature of the process chamber 201 at 630 degrees C. or less, it becomes possible to shorten the time required for lowering the internal temperature of the process chamber 201 such that the entire efficiency of the cleaning process can be increased. In addition, it becomes possible to avoid the member within the process chamber 201 from being damaged by heat. By setting the internal temperature of the process chamber 201 at 620 degrees C. or less, it becomes possible to further shorten the time required for lowering the internal temperature of the process chamber 201 such that the entire efficiency of the cleaning process can be further increased. Additionally, it becomes possible to more reliably avoid the member within the process chamber 201 from being damaged by heat.

(Multi-Stage Purge Step)

In a state where the internal temperature of the process chamber 201 is set to the third temperature, the multi-stage purge step (pressure width change purge) is performed. Further, the multi-stage purge step may be initiated when the aforementioned temperature rising step is initiated. At this step, first and second purge steps described later are sequentially performed.

[First Purge Step]

At this step, a purge (first purge) is performed to the interior of the process chamber 201, while periodically changing the internal pressure of the process chamber 201 to have a first pressure width described later. Specifically, a step (pressure increasing step 1a) of increasing the internal pressure of the process chamber 201 by supplying an $N_2$ gas as a purge gas into the process chamber 201 and a step (pressure decreasing step 2a) of decreasing the internal pressure of the process chamber 201 by vacuum-exhausting (vacuumizing) the interior of the process chamber 201 are set to a first one cycle and the first one cycle is repeated a plurality of times (two or more times).

At pressure increasing step 1a, in a state where the APC valve 244 is slightly opened, the valves 243c, 247c, 243d, and 247d are opened and the $N_2$ gas is supplied into the process chamber 201. Supply flow rates of the $N_2$ gas controlled by the MFCs 241c and 241d are set to fall within a range of, e.g., 5000 to 10000 sccm, respectively. A maximum pressure in the process chamber 201 is set to fall within a range of, e.g., 400 to 500 Torr (53200 to 66500 Pa).

The pressure increasing step 1a may be performed in a state where the APC valve 244 is fully closed. When the APC valve 244 is fully closed, it becomes possible to increase a maximum pressure in the process chamber 201, compared with when the APC valve 244 is slightly opened. When the APC valve 244 is slightly opened, a slight flow of the $N_2$ gas from the interior of the process chamber 201 toward the exhaust pipe 231 can be formed to suppress a reverse diffusion of the residual compound from the exhaust pipe 231 toward the interior of the process chamber 201.

At the pressure decreasing step 2a, in a state where the valves 243c, 247c, 243d, and 247d are opened and the $N_2$ gas is supplied into the process chamber 201, the APC valve 244 is fully opened. Supply flow rates of the $N_2$ gas controlled by the MFCs 241c and 241d are set to fall within a range of, e.g., 100 to 1000 sccm. A minimum pressure in the process chamber 201 is set to fall within a range of, e.g., 3 to 5 Torr (399 to 665 Pa).

Further, the pressure decreasing step 2a may be performed in a state where the valves 243c, 247c, 243d, and 247d are closed and the supply of the $N_2$ gas into the process chamber 201 is stopped. When the supply of the $N_2$ gas into the process chamber 201 is stopped, it becomes possible to lower the minimum pressure in the process chamber 201, compared with when the $N_2$ gas is supplied into the process chamber 201. When the $N_2$ gas is supplied into the process chamber 201, a flow of the $N_2$ gas from the interior of the process chamber 201 to the exhaust pipe 231 can be formed in the process chamber 201 to suppress a reverse diffusion of the residual compound from the exhaust pipe 231 toward the interior of the process chamber 201.

A first pressure width, i.e., a difference between the maximum pressure of the pressure increasing step 1a and the minimum pressure of the pressure decreasing step 2a, is greater than a second pressure width described later, and thus, it falls within a range of, e.g., 395 to 497 Torr (52535 to 66101 Pa). At the first purge step, by performing a purge process while changing the internal pressure of the process chamber 201 to have this large pressure width, it becomes possible to effectively remove the residual compound having a relatively large size remaining in the process chamber 201 through the exhaust pipe 231. Also, at the first purge step, by performing the aforementioned cycle a plurality of times, that is, by repeatedly increasing and decreasing the internal pressure of the process chamber 201 a plurality of times in a state where the first pressure width is maintained, it becomes possible to effectively remove the residual compound from the interior of the process chamber 201.

[Second Purge Step]

After the first purge step is completed, the second purge step is performed. During this step, a purge (second purge) is performed to the interior of the process chamber 201, while periodically changing the internal pressure of the process chamber 201 to have a second pressure width smaller than the aforementioned first pressure width. Specifically, a step (pressure increasing step 1b) of increasing the internal pressure of the process chamber 201 by supplying an N₂ gas as a purge gas into the process chamber 201 and a step (pressure decreasing step 2b) of decreasing the internal pressure of the process chamber 201 by vacuum-exhausting the interior of the process chamber 201 are set to a second one cycle and the second one cycle is repeated a plurality of times (two or more times).

The pressure increasing step 1b is performed in the same processing order as that of the pressure increasing step 1a of the first purge step. Supply flow rates of the N₂ gas controlled by the MFCs 241c and 241d are set to be smaller than those of the N₂ gas at the pressure increasing step 1a, for example, to fall within a range of, e.g., 1000 to 2000 sccm, respectively. A maximum pressure in the process chamber 201 is set to be smaller than that of the pressure increasing step 1a, for example, to fall within a range of, e.g., 0.6 to 1 Torr (79.8 to 133 Pa). At the pressure increasing step 1b, the APC valve 244 may be fully closed in a similar manner as the pressure increasing step 1a.

The pressure decreasing step 2b is performed in the same processing order as that of the pressure decreasing step 2a of the first purge step. Supply flow rates of the N₂ gas controlled by the MFCs 241c and 241d are set to be smaller than those of the N₂ gas of the pressure decreasing step 2a, for example, to fall within a range of, e.g., 0 to 10 sccm, respectively. A minimum pressure in the process chamber 201 is set to be equal to or smaller than that of the pressure decreasing step 2a, preferably, to be smaller than that of the pressure decreasing step 2a, for example, to fall within a range of, e.g., 0.01 to 0.02 Torr (1.33 to 2.66 Pa).

The second pressure width, i.e., a difference between the maximum pressure of the pressure increasing step 1b and the minimum pressure of the pressure decreasing step 2b, is smaller than the aforementioned first pressure width, and thus, it falls within a range of, e.g., 0.58 to 0.99 Torr (77.14 to 131.67 Pa). At the second purge step, by performing a purge process while changing the internal pressure of the process chamber 201 to have the second pressure width smaller than the first pressure width, the residual compound having a relatively small size remaining in the gas supply pipes 232a to 232d, in the nozzles 249a and 249b, and in the buffer chamber 237 can be effectively moved into the process chamber 201 and removed through the exhaust pipe 231. Also, during the second purge step, by performing the aforementioned cycle a plurality of times, i.e., by repeatedly increasing and decreasing the internal pressure of the process chamber 201 a plurality of times in a state where the second pressure width is maintained, the residual compound remaining in the gas supply pipes 232a to 232d, in the nozzles 249a and 249b, and in the buffer chamber 237 can be effectively moved into the process chamber 201 and removed through the exhaust pipe 231.

As the purge gas, it may be possible to use not only the N₂ gas but also, for example, the aforementioned rare gas.
(Temperature Decreasing and Atmosphere Returning Step)

After the multi-stage purge step is completed, the output of the heater 207 is adjusted to decrease the internal temperature of the process chamber 201 (temperature decreasing). That is, the internal temperature of the process chamber 201 is changed (decreased) from the third temperature to the first temperature. Further, the valves 243c, 247c, 243d, and 247d are opened to cause the N₂ gas to flow in the process chamber 201. Thus, the interior atmosphere of the process chamber 201 is substituted with the N₂ gas (inert gas substitution), and the internal pressure of the process chamber 201 returns to a normal pressure (return to an atmospheric pressure).
(Boat Unloading Step)

Thereafter, the seal cap 219 is moved down by the boat elevator 115 and the lower end of the manifold 209 is opened. The empty boat 217 is unloaded from the lower end of the manifold 209 to a position outside of the reaction tube 203 (boat unloading). When this series of cleaning process is completed, the aforementioned film forming process is resumed.

(4) Effects According to the Present Embodiment

According to the aforementioned embodiment, one or more effects set forth below may be achieved.

(a) In the first purge step, by performing the purge process while changing the internal pressure of the process chamber 201 based on the first pressure width greater than the second pressure width, it becomes possible to effectively remove the residual compound having a relatively large size remaining in the process chamber 201 through the exhaust pipe 231. Further, by maintaining the first pressure width when the internal pressure of the process chamber 201 is repeatedly increased and decreased a plurality of times, it becomes possible to reliably achieve the aforementioned effect, compared with a case where the first pressure width is not maintained when the internal pressure of the process chamber 201 is repeatedly increased and decreased a plurality of times (for example, a case where the first pressure width is gradually reduced each time the internal pressure of the process chamber 201 is increased and decreased). Thus, it becomes possible to enhance the quality of the film forming process performed after the cleaning process.

(b) In the second purge step, by performing the purge process while changing the internal pressure of the process chamber 201 based on the second pressure width smaller than the first pressure width, the residual compound having a relatively small size, which remains in the gas supply pipes 232a to 232d, in the nozzles 249a and 249b, and in the buffer chamber 237, can be effectively moved into the process chamber 201 and removed through the exhaust pipe 231. Further, by maintaining the second pressure width when the internal pressure of the process chamber 201 is repeatedly increased or decreased a plurality of times, it becomes possible to reliably achieve the aforementioned effect, compared with a case where the second pressure width is not maintained when the internal pressure of the process chamber 201 is repeatedly increased and decreased a plurality of times (for example, a case where the second pressure width is gradually reduced each time the internal pressure of the process chamber 201 is increased and decreased). Thus, it becomes possible to further enhance the quality of the film forming process performed after the cleaning process.

(c) By increasing the internal temperature of the process chamber 201 to the third temperature higher than the second temperature when the multi-stage purge step is performed, it is possible to sublimate the residual compound adhering to the surface of the member within the process chamber 201. Accordingly, it becomes possible to increase the efficiency of removing the residual compound at the multi-stage purge step. Further, by setting the third temperature at a temperature equal to or higher than the first temperature, further, exceeding the first temperature, it becomes possible to promote the sublimation of the residual compound to further increase the efficiency of removing the residual compound at the multi-stage purge step. Thus, it becomes possible to further enhance the quality of the film forming process performed after the cleaning process.

(d) At the multi-stage purge step, by performing the first and second purge steps in this order, it becomes possible to increase the efficiency of removing the residual compound, compared with a case where the first and second purge steps are performed in a different order. Thus, it becomes possible to further enhance the quality of the film forming process performed after the cleaning process.

(e) The aforementioned effects may also be achieved in a case where a fluorine-based gas other than the $F_2$ gas is used as a cleaning gas or an inert gas other than an $N_2$ gas is used as a purge gas. Further, the same effects may also be achieved in a case where a Si-containing gas other than a DCS gas is used as a precursor gas or in a case where an N-containing gas other than an $NH_3$ gas is used as a reaction gas.

(5) Modifications

The sequence of the cleaning process in the present embodiment is not limited to the form illustrated in FIG. 5 but may be modified as in modifications described below.
(Modification 1)

Figure 6:
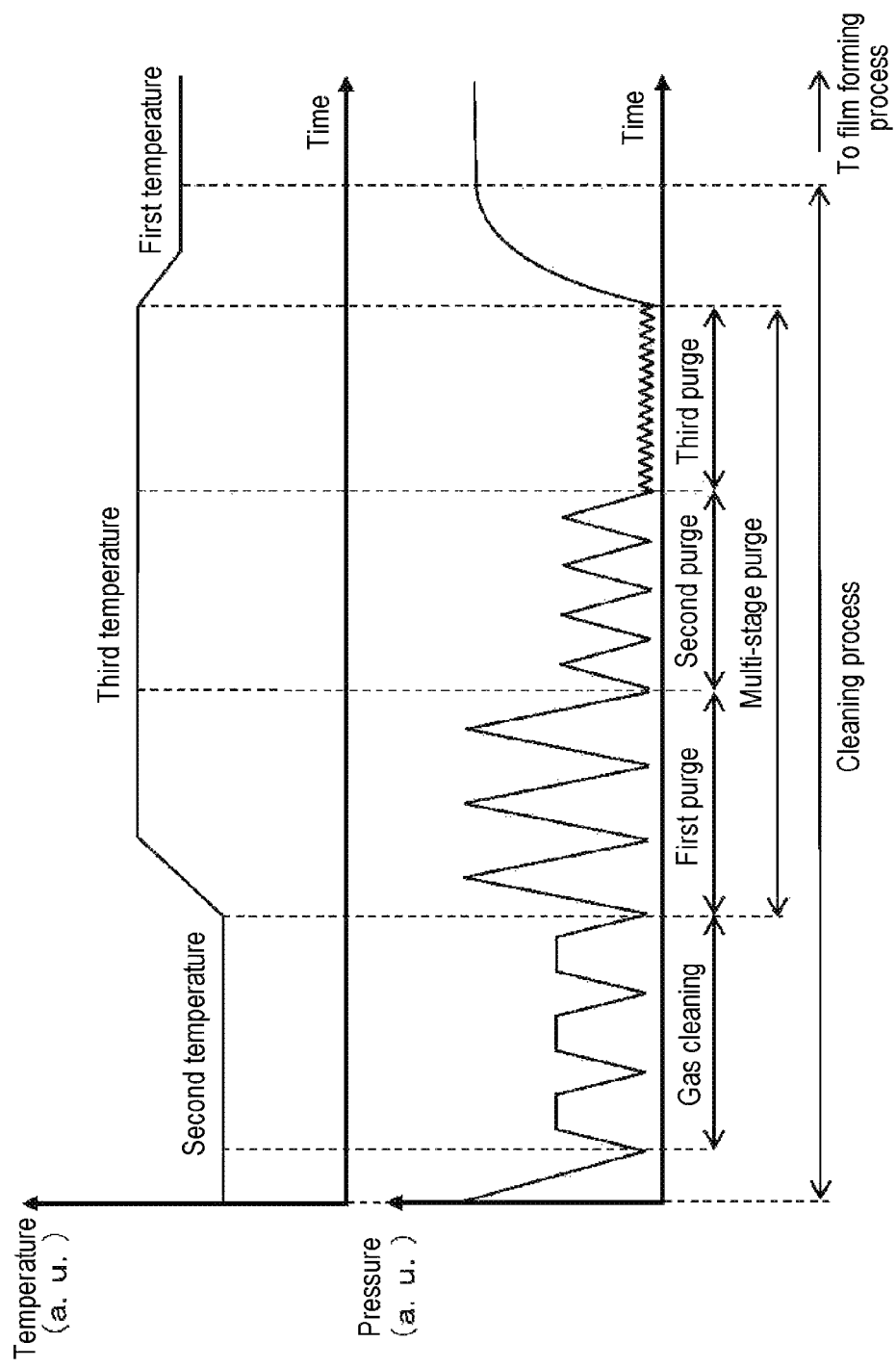
FIG. 6 is a view illustrating a modification of the cleaning sequence according to one embodiment of the present disclosure.

As illustrated in FIG. 6, at the multi-stage purge step, a third purge step of performing purge (third purge) to the interior of the process chamber 201 may be performed, while periodically changing the internal pressure of the process chamber 201 based on a third pressure width smaller than the second pressure width, after the second purge step is completed.

In the third purge step, a step (pressure increasing step 1c) of increasing the internal pressure of the process chamber 201 by supplying an $N_2$ gas as a purge gas into the process chamber 201 and step (pressure decreasing step 2c) of decreasing the internal pressure of the process chamber 201 by vacuum-exhausting the interior of the process chamber 201 are set to a third one cycle and the third one cycle is repeated a plurality of times (two or more times).

The pressure increasing step 1c is performed in the same processing order as that of the pressure increasing step 1a of the first purge step. Supply flow rates of the $N_2$ gas controlled by the MFCs 241c and 241d are set to be smaller than the supply flow rate of the $N_2$ gas of the pressure increasing step 1a and greater than the supply flow rate of the $N_2$ gas of the pressure increasing step 1b, for example, to fall within a range of 2000 to 5000 sccm, respectively. A maximum pressure in the process chamber 201 is set to be about equal to or lower than that of the pressure increasing step 1b, for example, to fall within a range of 0.5 to 1 Torr (66.5 to 133 Pa). At the pressure increasing step 1c, the APC valve 244 may be fully closed as in the pressure increasing step 1a.

The pressure decreasing step 2c is performed in the same processing order as that of the pressure decreasing step 2a of the first purge step. Supply flow rates of the $N_2$ gas controlled by the MFCs 241c and 241d are set to be about equal to the supply flow rate of the $N_2$ gas of the pressure decreasing step 2a and greater than the supply flow rate of the $N_2$ gas of the pressure decreasing step 2b, for example, to fall within a range of 100 to 1000 sccm, respectively. A minimum pressure in the process chamber 201 is set to be greater than that of the pressure decreasing step 2a, for example, to fall within a range of 0.1 to 0.3 Torr (13.3 to 39.9 Pa).

A third pressure width, that is, a difference between the maximum pressure of the pressure increasing step 1c and the minimum pressure of the pressure decreasing step 2c is smaller than the aforementioned second pressure width, for example, it is set to fall within a range of 0.2 to 0.9 Torr (26.6 to 119.7 Pa).

Also, in this modification, the same effects as those of the cleaning process illustrated in FIG. 5 may be achieved.

Further, by performing the third purge step after the first and second purge steps, it becomes possible to effectively remove the residual compound having a small size, which has not been completely removed through the first and second purge steps, from the interior of the process chamber 201, from the interior of the gas supply pipes 232a to 232d, from the interior of the nozzles 249a and 249b, and from the interior of the buffer chamber 237. Further, at the third purge step, by maintaining the third pressure width when the internal pressure of the process chamber 201 is repeatedly increased and decreased a plurality of times, it becomes possible to effectively remove the residual compound remaining in the process chamber 201, in the gas supply pipes 232a to 232d, in the nozzles 249a and 249b, and in the buffer chamber 237, compared with a case where the third pressure width is not maintained when the internal pressure of the process chamber 201 is repeatedly increased and decreased a plurality of times (for example, a case where the third pressure width is gradually reduced each time the internal pressure of the process chamber 201 is increased and decreased).

Further, by performing the first, second, and third purge steps in this order, it becomes possible to increase the efficiency of removing the residual compound from the interior of the process chamber 201, from the interior of the gas supply pipes 232a to 232d, and from the interior of the nozzles 249a and 249b, from the interior of the buffer chamber 237, and the like, compared with a case where these steps are performed in a different order. Thus, it becomes possible to further enhance the quality of the film forming process performed after the cleaning process.
(Modification 2)

Figure 7:
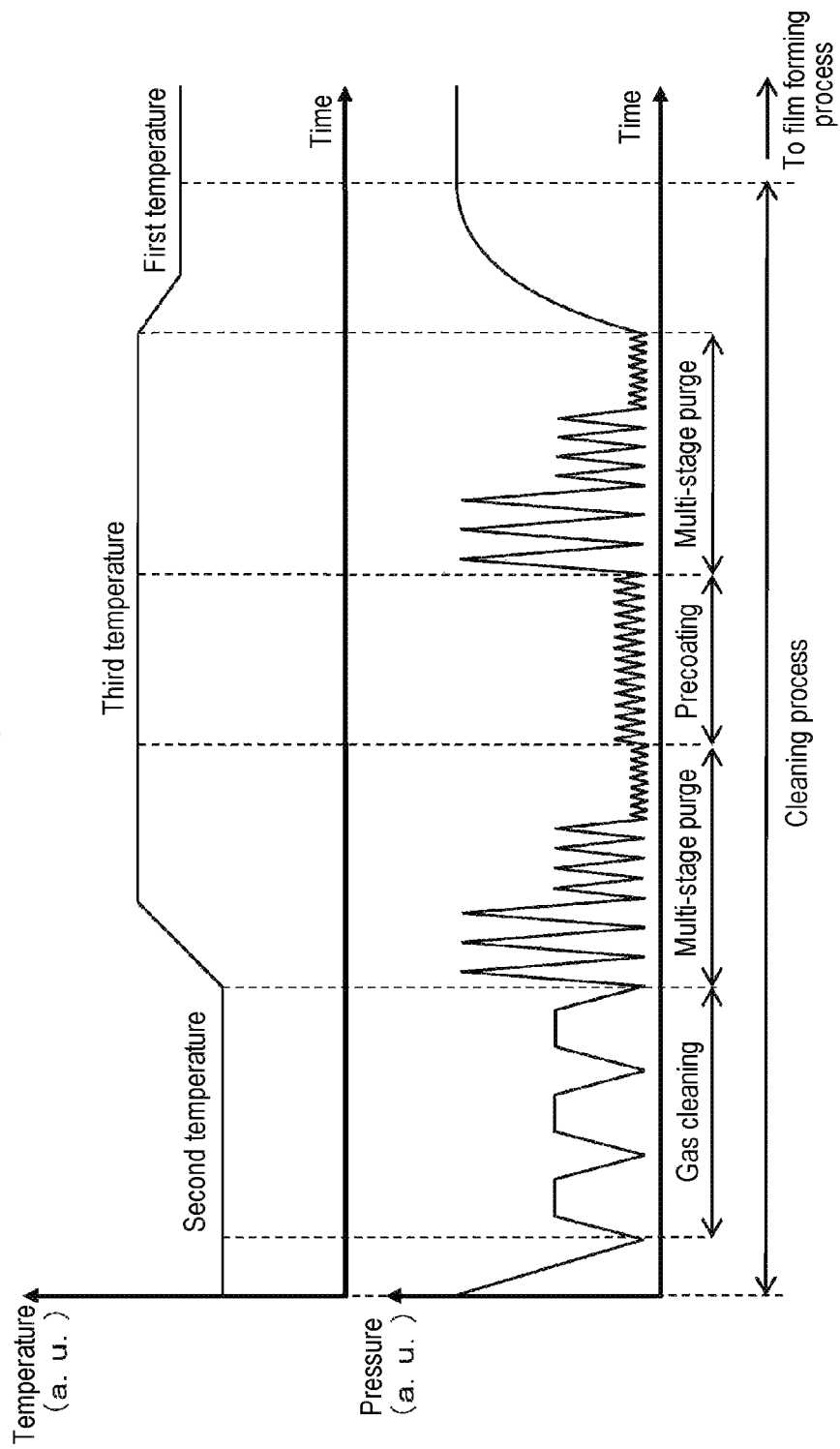
FIG. 7 is a view illustrating a modification of the cleaning sequence according to one embodiment of the present disclosure.

After the gas cleaning step and the multi-stage purge step are performed, a precoating step of performing a precoating of the interior of the process chamber 201 may be performed by supplying a process gas into the process chamber 201. At the precoating step, in a state where the empty boat 217 is loaded into the process chamber 201, the same process as the aforementioned film forming process is performed and an SiN layer as a precoating layer is formed on a surface of the member within the process chamber 201. The processing procedures and processing conditions of the precoating step may be the same as those of the aforementioned film forming process, except for the internal temperature of the process chamber 201. The internal temperature of the process chamber 201 of the precoating step is set to a temperature higher by, e.g., 50 to 100 degrees C. than the aforementioned first temperature. Thus, it becomes possible to shorten the overall time for performing the cleaning process by setting a deposition rate of the precoating layer to be greater than that of the SiN film at the film forming step. Further, FIG. 7 illustrates an example in which the internal temperature of the process chamber 201 at the precoating step is equal to that (third temperature) of the process chamber 201 at the multi-stage purge step. In this manner, the standby time taken to increase and decrease the internal temperature of the process chamber 201 can become unnecessary, thereby shortening the overall time for performing the cleaning process. A thickness of the precoating layer is set to fall within a range of, e.g., 20 to 50 nm.

Also, in this modification, the same effects as those of the cleaning process illustrated in FIG. 5 may be achieved.

Further, according to this modification, by performing the precoating process, the residual compound remaining in the process chamber 201 can be reacted and stabilization can be achieved. In addition, by fixing the residual compound remaining in the process chamber 201 by the precoating layer, it becomes possible to suppress the generation of particles. Thus, it becomes possible to further enhance the quality of the film forming process performed after the cleaning process.

Further, by performing the precoating step after the multi-stage purge step is performed, i.e., by performing the precoating step after the residual compound is removed from the inner wall, etc. of the process chamber 201 as an underlayer of the precoating layer, it becomes possible to suppress the generation of a foreign object caused as the precoating layer is delaminated together with the residual compound. As a result, it becomes possible to further enhance the quality of the film forming process performed after the cleaning process.

(Modification 3)

As illustrated in FIG. 7, after the precoating step is performed, the aforementioned multi-stage purge step may be performed again. When the multi-stage purge step is performed again, the first and second purge steps may be performed in this order or the first, second, and third steps may be performed in this order. The processing procedures and processing conditions of the multi-stage purge step performed after the precoating step, may be the same as those of the multi-stage purge step performed before the precoating step.

Also, in this modification, the same effects as those of the cleaning process illustrated in FIG. 5 or those of modification 2 may be achieved. Further, by performing the multi-stage purge step again after the precoating step is performed, in a case where a foreign object is generated by performing the precoating step, it becomes possible to effectively remove the foreign object from the interior of the process chamber 201. In addition, by performing the first and second purge steps in this order or the first, second, and third purge steps in this order after the precoating step is performed, in a case where a foreign object is generated by performing the precoating step, it becomes possible to further effectively remove the foreign object from the interior of the process chamber 201. Thus, it becomes possible to further enhance the quality of the film forming process performed after the cleaning process.

(Modification 4)

At the second purge step, an $N_2$ gas may be supplied into the process chamber 201 by a flash flow at the pressure increasing step 1b.

When the flash flow supply is performed, the valves 247c and 247d are closed and the valves 243c and 243d are opened in order to charge the $N_2$ gas into the gas supply pipe 232c (hereinafter, referred to as a gas reservoir part) between the valves 247c and 243c and into the gas supply pipe 232d (hereinafter, referred to as a gas reservoir part) between the valves 247d and 243d, respectively. Further, when a predetermined amount of $N_2$ gas gathers in the gas reservoir part, the valves 243c and 243d are closed while the valves 247c and 247d are opened. Thus, it is possible to immediately supply the high pressure $N_2$ gas stored in advance in the gas reservoir part into the process chamber 201 in a vacuumed state through the nozzles 249a and 249b and the buffer chamber 237.

Also, in this modification, the same effects as those of the cleaning processing illustrated in FIG. 5 may be achieved. Further, at the second purge step, by supplying the $N_2$ gas into the process chamber 201 through the flash flow, the residual compound having a relatively small size remaining in the gas supply pipes 232a to 232d, in the nozzles 249a and 249b, and in the buffer chamber 237, can be extruded, more effectively moved into the process chamber 201, and removed through the exhaust pipe 231. Thus, it becomes possible to further enhance the quality of the film forming process performed after the cleaning process.

As the gas reservoir part, the gas supply pipes 232c and 232d may be used as mentioned above, and an airtight vessel (tank) may be newly installed and used in the gas supply pipes 232c and 232d. For example, a tank having a volume larger than that of the gas supply pipes 232c and 232d may be installed between the valves 243c and 247c in the gas supply pipe 232c and between the valves 243d and 247d in the gas supply pipe 232d, respectively, and used as the gas reservoir part. In this case, by increasing a supply amount of the $N_2$ gas by the flash flow, it becomes possible to further increase the efficiency of removing the residual compound from the interior of the gas supply pipes 232a to 232d, from the interior of the nozzles 249a and 249b, and from the interior of the buffer chamber 237.

Other Embodiments of the Present Disclosure

An embodiment of the present disclosure has been described in detail above. However, the present disclosure is not limited to the aforementioned embodiment but may be variously modified without departing from the scope of the present disclosure.

For example, in the aforementioned embodiment, there has been described an example in which, when the SiN film is formed on the wafer, steps 1 and 2 are performed non-simultaneously. However, the present disclosure is not limited thereto and steps 1 and 2 may be performed simultaneously a predetermined number of times (n times). Also, in this case, the film formation may be performed under the same processing conditions as those of the aforementioned embodiment. Further, the cleaning process may be performed on the interior of the process chamber in the same processing procedures and the same processing conditions as those of the aforementioned embodiment.

Further, for example, in the aforementioned embodiment, there has been described an example in which, after the SiN film is formed on the wafer, the cleaning process is performed on the interior of the process chamber. However, the present disclosure is not limited thereto. For example, the aforementioned cleaning process may also be appropriately applied in a case where the cleaning process is performed on the interior of the process chamber after a film containing a semi-metal element, i.e., a semi-metal-based thin film, such as a silicon film (Si film), a silicon carbide film (SiC film), a silicon carbonitride film (SiCN film), a silicon oxide film (SiO film), a silicon oxycarbide film (SiOC film), a silicon oxynitride film (SiON film), a silicon oxycarbonitride film (SiOCN film), a silicon boronitride film (SiBN film), a silicon boron carbonitride film (SiBCN film), a boron nitride film (BN film), a boron carbonitride film (BCN film), a germanium film (Ge film), a silicon germanium film (SiGe film), or the like is formed on the wafer.

Further, for example, the present disclosure may also be appropriately applied to a case where the cleaning process is performed on the interior of the process chamber after a film containing a metal element, i.e., a metal-based thin film, such as titanium (Ti), zirconium (Zr), hafnium (Hf), tantalum (Ta), niobium (Nb), molybdenum (Mo), tungsten (W), yttrium (Y), lanthanum (La), strontium (Sr), or aluminum (Al) is formed on the wafer. That is, the present disclosure may also be applied to a case where the cleaning process is performed on the interior of the process chamber after a nitride film, a carbonitride film, an oxide film, an oxycarbide film, an oxynitride film, an oxycarbonitride film, a boron nitride film, a boron carbonitride film, a single metal element film, or the like containing a metal element such as Ti, Zr, Hf, Ta, Nb, Mo, W, Y, La, Sr, Al, etc. is formed on the wafer.

That is, the present disclosure may also be appropriately applied to a case where the cleaning process is performed on the interior of the process chamber after the process of forming a film containing a semi-metal element or a metal element on the wafer is performed. The processing procedures and processing conditions of the cleaning process may be the same as those of the aforementioned embodiment or modifications. Also in these cases, the same effects as those of the aforementioned embodiment or modifications may be achieved.

Preferably, the recipes used in the film forming process or the cleaning process (programs in which the processing procedures, processing conditions, or the like are written) may be individually prepared according to the processing contents (the type of a film to be formed or removed, a composition ratio, a film quality, a film thickness, processing procedures, processing conditions, etc.), and stored in advance in the memory device 121c via an electrical communication line or the external memory device 123. In addition, at the start of the processing, preferably, the CPU 121a appropriately selects a suitable recipe from among the plurality of recipes stored in the memory device 121c according to the processing contents. This enables a single substrate processing apparatus to form films having different film types, composition ratios, film qualities, and film thicknesses with high reproducibility, and to perform appropriate processing on each case. Further, this can reduce an operator's operation burden (a burden borne by an operator when inputting the processing procedures or processing conditions, or the like), thereby avoiding a manipulation error and quickly starting the processing.

The recipes described above are not limited to newly prepared ones but may be prepared by, for example, modifying the existing recipes already installed in the substrate processing apparatus. In the case of modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may also be appropriately applied to, for example, a case where films are formed using a single-wafer-type substrate processing apparatus capable of processing one or several substrates at a time. In addition, in the aforementioned embodiment, there has been described an example in which films are formed using a substrate processing apparatus having a hot-wall-type processing furnace. The present disclosure is not limited to the aforementioned embodiment but may also be appropriately applied to a case where films are formed using substrate processing apparatus having a cold-wall-type processing furnace. Also in these cases, the processing procedures and processing conditions may be the same as, for example, those of the aforementioned embodiment.

Figure 10A:
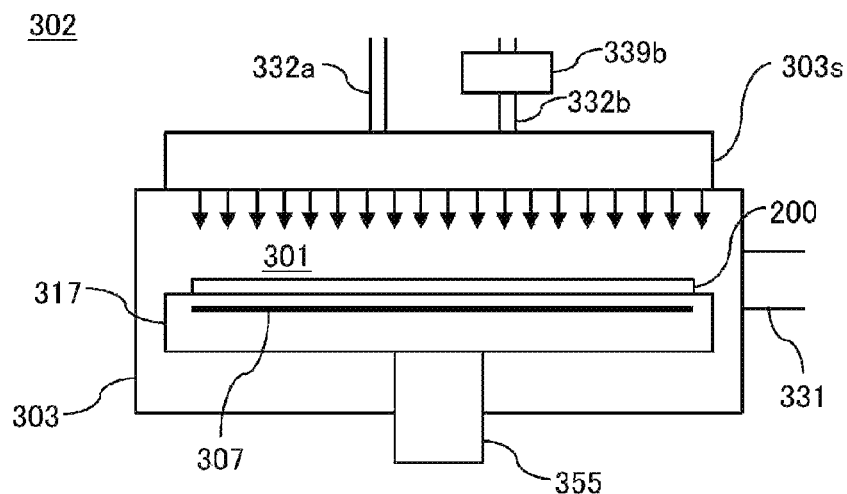
FIG. 10A is a schematic configuration view of a processing furnace of a substrate processing apparatus appropriately used in another embodiment of the present disclosure, in which the processing furnace part is illustrated in a longitudinal cross-sectional view.

For example, the present disclosure may also be appropriately applied to a case where films are formed using a substrate processing apparatus having a processing furnace 302 illustrated in FIG. 10A. The processing furnace 302 includes a process vessel 303 forming a process chamber 301, a shower head 303s serving as a gas supply part for supplying a gas in the form of a shower into the process chamber 301, a support table 317 configured to support one or several wafers 200 in a horizontal posture, a rotary shaft 355 configured to support the support table 317 from the lower part, and a heater 307 installed in the support table 317. An inlet (gas introduction port) of the shower head 303s is connected with gas supply ports 332a and 332b. The gas supply port 332a is connected with a supply system in the same manner as the precursor gas supply system and the cleaning gas supply system of the aforementioned embodiment. The gas supply port 332b is connected with a remote plasma unit (plasma generating device) 339b serving as an excitation part for supplying a gas by plasma-exciting the same, and a supply system similar to the reaction gas supply system of the aforementioned embodiment. A gas distribution plate for supplying a gas in the form of a shower into the process chamber 301 is installed in an outlet (gas discharging port) of the shower head 303s. The shower head 303s is installed at a position facing the surface of the wafer 200 loaded into the process chamber 301. An exhaust port 331 for exhausting the interior of the process chamber 301 is installed in the process vessel 303. The exhaust port 331 is connected with an exhaust system similar to the exhaust system of the aforementioned embodiment.

Figure 10B:
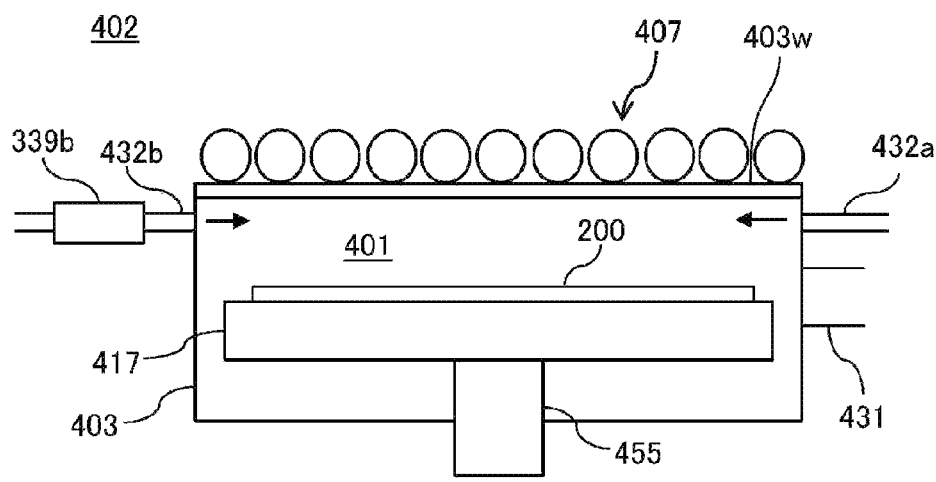
FIG. 10B is a schematic configuration view of a processing furnace of a substrate processing apparatus appropriately used in another embodiment of the present disclosure, in which the processing furnace part is illustrated in a longitudinal cross-sectional view.

In addition, for example, the present disclosure may also be appropriately applied to a case where films are formed using a substrate processing apparatus having a processing furnace 402 illustrated in FIG. 10B. The processing furnace 402 includes a process vessel 403 configured to form a process chamber 401, a support table 417 configured to support one or several wafers 200 in a horizontal posture, a rotary shaft 455 configured to support the support table 417 from the lower part, a lamp heater 407 configured to irradiate light toward the wafers 200 in the process vessel 403, and a quartz window 403w configured to allow the light irradiated from the lamp heater 407 to transmit therethrough. The process vessel 403 is connected with gas supply ports 432a and 432b. The gas supply port 432a is connected with a supply system in the same manner as the precursor gas supply system and the cleaning gas supply system of the aforementioned embodiment. The gas supply port 432b is connected with a supply system in the same manner as the aforementioned remote plasma unit 339b and the reaction gas supply system of the aforementioned embodiment. The gas supply ports 432a and 432b are respectively installed on sides of the end portions of the wafer 200 loaded into the process chamber 301, namely, at positions that do not face the surface of the wafer 200 loaded into the process chamber 301. An exhaust port 431 configured to exhaust the interior of the process chamber 401 is installed in the process vessel 403. The exhaust port 431 is connected with an exhaust system identical to the exhaust system in the aforementioned embodiment.

Even when these substrate processing apparatuses are used, the film forming process or the cleaning process may be performed under the same processing procedures and processing conditions as those of the aforementioned embodiment or modifications, and the same effects as those of the aforementioned embodiment or modifications may be achieved.

Also, the aforementioned embodiment, modifications, or the like may be appropriately combined with each other to be used. In this case, the processing procedures and processing conditions may be the same as those of the aforementioned embodiment or modifications.

EXAMPLES

Hereinafter, the experiment results supporting the effects achieved in the aforementioned embodiment will be described.

As an example, after the cleaning process was performed on the interior of the process chamber after the film forming process based on the cleaning sequence illustrated in FIG. 7 using the substrate processing apparatus of the aforementioned embodiment, the film forming process (batch processing) based on the film forming sequence illustrated in FIG. 4 was performed three times. A DCS gas was used as a precursor gas, an $HN_3$ gas was used as a reaction gas, an $F_2$ gas was used as a cleaning gas, and an $N_2$ gas was used as a purge gas. Further, at the second purge step of the multi-stage purge step of the cleaning process, the $N_2$ gas is supplied into the process chamber by the flash flow. The processing conditions are within the range of the processing conditions described in the aforementioned embodiment. Each time the batch processing is completed, the number of particles adhered onto the wafer after the film forming process located in the upper, central, and lower portions of the wafer arrangement region was measured.

Figure 8:
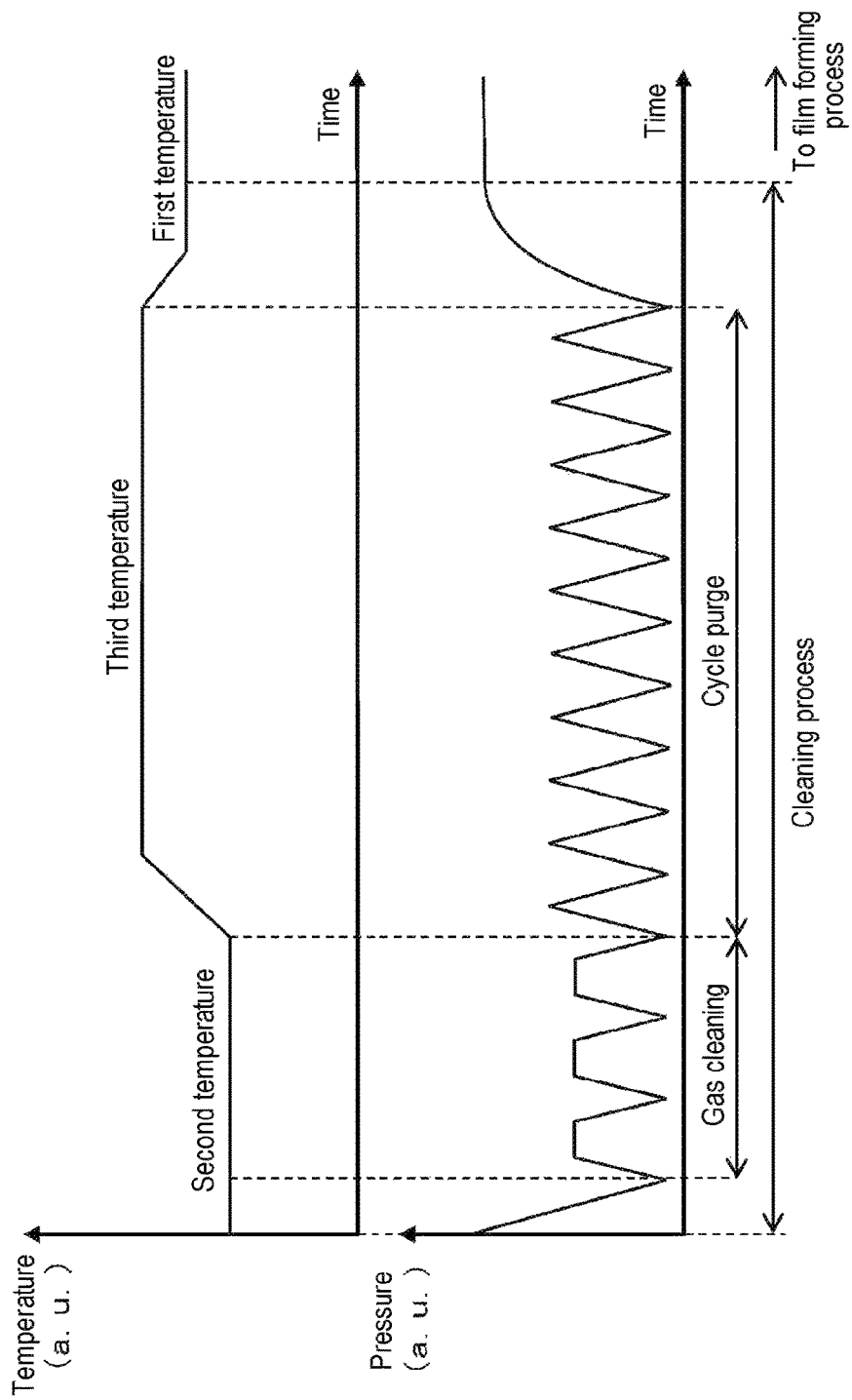
FIG. 8 is a view illustrating a cleaning sequence according to a comparative example.

As a comparative example, after the cleaning process based on the cleaning sequence illustrated in FIG. 8 was performed on the interior of the process chamber after the film forming process using the substrate processing apparatus of the aforementioned embodiment, the film forming process (batch processing) based on the film forming sequence illustrated in FIG. 4 was performed three times. A DCS gas was used as a precursor gas, an $HN_3$ gas was used as a reaction gas, an $F_2$ gas was used as a cleaning gas, and an $N_2$ gas was used as a purge gas. In cleaning process, a cleaning step was performed in the same processing procedures and processing conditions as those of the embodiment. Thereafter, a cycle purge step was performed in the same processing procedures as those of the first purge step of the embodiment. When the cycle purge step is performed, a pressure difference in the process chamber was maintained to have a predetermined size smaller than the pressure difference in the process chamber at the first purge step of the embodiment. Each time the batch processing was completed, the number of particles adhering onto the wafer after the film forming processing located in the upper, central, and lower portions of the wafer arrangement region was measured.

Figure 9:
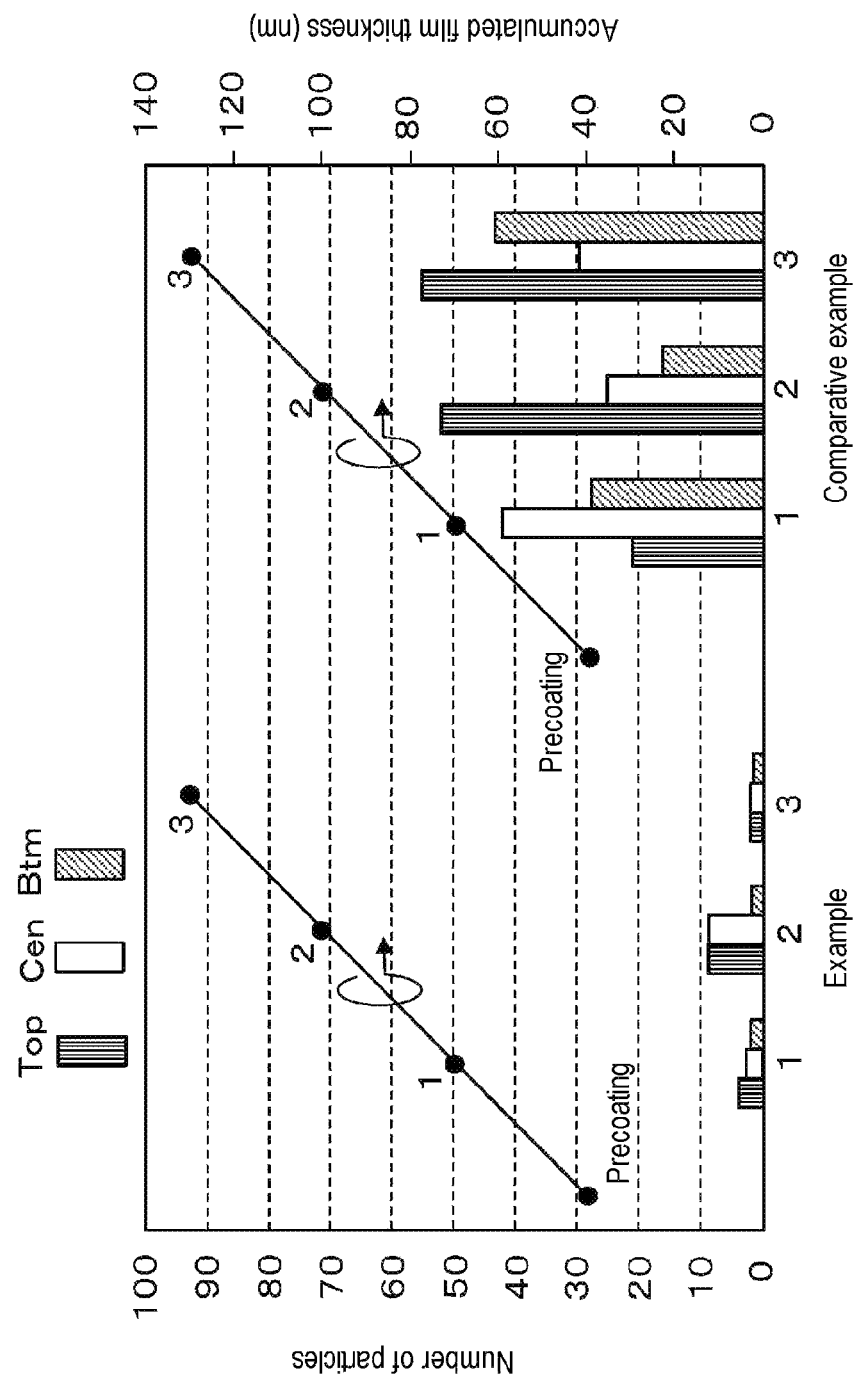
FIG. 9 is a view illustrating the results obtained by measuring the number of particles adhered onto a substrate.

The bar graphs of FIG. 9 indicate the numbers of particles adhered onto the wafer, and the line graphs indicate accumulated film thicknesses. In FIG. 9, the horizontal axis sequentially represents the embodiment and the comparative example. In the drawing, "Top," "Cen," and "Btm" indicate upper, central, and lower portions in the wafer arrangement region, respectively, and "1," "2," and "3" indicate the number of batch processes performed, respectively. The vertical axis on the left of FIG. 9 represents the number of particles adhered onto the wafer, and the vertical axis on the right represents an accumulated film thickness (nm).

From FIG. 9, it can be seen that the number of particles of the example measured after the cleaning process was completed is far smaller than that of the comparative example. It is considered that this is because, by performing the multi-stage purge step after the gas cleaning step is performed, the residual compound could be effectively removed from the interior of the process chamber, compared with the case where only the cycle purge step is performed after the gas cleaning step is performed.

According to the present disclosure in some embodiments, it is possible to enhance the quality of substrate processing by increasing the effect of removing a compound in a process chamber, which is generated by performing the cleaning process.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

processing a substrate to manufacture the semiconductor device by supplying a process gas to the substrate in a process chamber;

unloading the processed substrate from the process chamber after the act of processing the substrate;

after the act of unloading the processed substrate, supplying a cleaning gas into the process chamber to etch deposits, which are adhered to an interior of the process chamber during the act of processing the substrate;

after the act of supplying the cleaning gas, performing a first purge to the interior of the process chamber by performing a first cycle a plurality of a first predetermined number of times, the first cycle including:
    supplying a purge gas into the process chamber to increase an internal pressure of the process chamber to a first maximum pressure; and
    vacuum-exhausting the interior of the process chamber to decrease the internal pressure of the process chamber to a first minimum pressure; and after the act of performing the first purge, performing a second purge to the interior of the process chamber by performing a second cycle a plurality of a second predetermined number of times, the second cycle including:
    supplying a purge gas into the process chamber to increase the internal pressure of the process chamber to a second maximum pressure; and
    vacuum-exhausting the interior of the process chamber to decrease the internal pressure of the process chamber to a second minimum pressure, wherein a difference between the second maximum pressure and the second minimum pressure is smaller than a difference between the first maximum pressure and the first minimum pressure.

2. The method of claim 1, wherein the second maximum pressure in the process chamber in the act of performing the second purge is set to be smaller than the first maximum pressure in the process chamber in the act of performing the first purge.

3. The method of claim 1, wherein the act of performing the first purge and the act of performing the second purge are performed in this order.

4. The method of claim 1, further comprising performing a precoating of the interior of the process chamber by supplying a process gas into the process chamber, after the act of performing the first purge and the act of performing the second purge are performed.

5. The method of claim 1, further comprising performing a third purge to the interior of the process chamber by performing a third cycle a plurality of a third predetermined number of times, the third cycle including:
supplying a purge gas into the process chamber to increase the internal pressure of the process chamber to a third maximum pressure; and
vacuum-exhausting the interior of the process chamber to decrease the internal pressure of the process chamber to a third minimum pressure,
wherein a difference between the third maximum pressure and the third minimum pressure is smaller than the difference between the second maximum pressure and the second minimum pressure.

6. The method of claim 1, wherein, in the act of performing the second purge, the purge gas is supplied into the process chamber by a flash flow in the process of increasing the internal pressure of the process chamber.

7. The method of claim 1, wherein in the act of supplying the cleaning gas, a fluorine-based gas is supplied as the cleaning gas into the process chamber, and
wherein the act of performing the first purge and the act of performing the second purge are performed after the act of supplying the cleaning gas is performed.

8. The method of claim 1, wherein the act of performing the first purge and the act of performing the second purge are performed at a temperature equal to or higher than an internal temperature of the process chamber in the act of processing the substrate.

9. The method of claim 1, wherein the act of performing the first purge and the act of performing the second purge are performed at a temperature higher than an internal temperature of the process chamber in the act of processing the substrate.

10. The method of claim 1, wherein the act of performing the first purge and the act of performing the second purge are performed in a state where no substrate is present in the process chamber.

11. The method of claim 4, wherein, after the act of performing the precoating is performed, the act of performing the first purge and the act of performing the second purge are performed again.

12. The method of claim 5, wherein the third maximum pressure in the process chamber in the act of performing the third purge is set to be equal to or smaller than the second maximum pressure in the process chamber in the act of performing the second purge.

13. The method of claim 5, wherein the act of performing the first purge, the act of performing the second purge, and the act of performing the third purge are performed in this order.

14. The method of claim 5, further comprising performing a precoating of the interior of the process chamber by supplying a process gas into the process chamber, after the act of performing the first purge, the act of performing the second purge, and the act of performing the third purge are performed.

15. The method of claim 14, wherein, after the act of performing the precoating is performed, the act of performing the first purge and the act of performing the second purge are performed again.

16. The method of claim 14, wherein, after the act of performing the precoating is performed, the act of performing the first purge, the act of performing the second purge, and the act of performing the third purge are performed again.

17. The method of claim 14, wherein, after the act of performing the precoating is performed, the act of performing the first purge, the act of performing the second purge, and the act of performing the third purge are performed in this order.

18. The method of claim 7, wherein the act of performing the first purge and the act of performing the second purge are performed at a temperature higher than an internal temperature of the process chamber in the act of supplying the cleaning gas.

19. A substrate processing apparatus, comprising:
a process chamber in which a substrate is processed;
a gas supply system configured to supply a gas to the process chamber;
an exhaust system configured to exhaust an interior of the process chamber; and
a control part configured to control the gas supply system and the exhaust system to perform:
processing the substrate to manufacture a semiconductor device by supplying a process gas to the substrate in the process chamber;
unloading the processed substrate from the process chamber after the act of processing the substrate;
after the act of unloading the processed substrate, supplying a cleaning gas into the process chamber to etch deposits, which are adhered to the interior of the process chamber during the act of processing the substrate;
after the act of supplying the cleaning gas, performing a first purge to the interior of the process chamber by performing a first cycle a plurality of a first predetermined number of times, the first cycle including:
supplying a purge gas into the process chamber to increase the internal pressure of the process chamber to a first maximum pressure; and
vacuum-exhausting the interior of the process chamber to decrease the internal pressure of the process chamber to a first minimum pressure; and
after the act of performing the first purge, performing a second purge to the interior of the process chamber by performing a second cycle a plurality of a second predetermined number of times, the second cycle including:
supplying a purge gas into the process chamber to increase the internal pressure of the process chamber to a second maximum pressure; and
vacuum-exhausting the interior of the process chamber to decrease the internal pressure of the process chamber to a second minimum pressure,
wherein a difference between the second maximum pressure and the second minimum pressure is smaller than a difference between the first maximum pressure and the first minimum pressure.

20. A non-transitory computer-readable recording medium storing a program that causes a substrate processing apparatus to perform a process by a computer, the process comprising:

processing a substrate to manufacture a semiconductor device by supplying a process gas to the substrate in a process chamber of the substrate processing apparatus;

unloading the processed substrate from the process chamber after the act of processing the substrate;

after the act of unloading the processed substrate, supplying a cleaning gas into the process chamber to etch deposits, which are adhered to an interior of the process chamber during the act of processing the substrate;

after the act of supplying the cleaning gas, performing a first purge to the interior of the process chamber by performing a first cycle a plurality of a first predetermined number of times, the first cycle including:
supplying a purge gas into the process chamber to increase the internal pressure of the process chamber to a first maximum pressure; and
vacuum-exhausting the interior of the process chamber to decrease the internal pressure of the process chamber to a first minimum pressure; and after the act of performing the first purge, performing a second purge to the interior of the process chamber by performing a second cycle a plurality of a second predetermined number of times, the second cycle including:
supplying a purge gas into the process chamber to increase an internal pressure of the process chamber to a second maximum pressure; and
vacuum-exhausting the interior of the process chamber to decrease the internal pressure of the process chamber to a second minimum pressure, wherein a difference between the second maximum pressure and the second minimum pressure is smaller than a difference between the first maximum pressure and the first minimum pressure.

21. A method of cleaning an interior of a process chamber in which a substrate was processed, comprising:

unloading the substrate from the process chamber after the substrate was processed;

after the act of unloading the processed substrate, supplying a cleaning gas into the process chamber to etch deposits, which are adhered to the interior of the process chamber while the substrate was processed;

after the act of supplying the cleaning gas, performing a first purge to the interior of the process chamber by performing a first cycle a plurality of a first predetermined number of times, the first cycle including:
supplying a purge gas into the process chamber to increase an internal pressure of the process chamber to a first maximum pressure; and
vacuum-exhausting the interior of the process chamber to decrease the internal pressure of the process chamber to a first minimum pressure; and after the act of performing the first purge, performing a second purge to the interior of the process chamber by performing a second cycle a plurality of a second predetermined number of times, the second cycle including:
supplying a purge gas into the process chamber to increase the internal pressure of the process chamber to a second maximum pressure; and
vacuum-exhausting the interior of the process chamber to decrease the internal pressure of the process chamber to a second minimum pressure, wherein a difference between the second maximum pressure and the second minimum pressure is smaller than a difference between the first maximum pressure and the first minimum pressure.

* * * * *